United States Patent
Pang et al.

(10) Patent No.: US 11,926,695 B2
(45) Date of Patent: *Mar. 12, 2024

(54) HIGH-THERMAL CONDUCTIVE EPOXY COMPOUND AND COMPOSITION, MATERIAL FOR SEMICONDUCTOR PACKAGE, MOLDED PRODUCT, ELECTRIC AND ELECTRONIC DEVICE, AND SEMICONDUCTOR PACKAGE INCLUDING THE SAME

(71) Applicant: Samsung Electronics Co., Ltd., Suwon-si (KR)

(72) Inventors: Kyeong Pang, Suwon-si (KR); In Kim, Suwon-si (KR); Jonghoon Won, Yongin-si (KR); Mooho Lee, Suwon-si (KR); Hyejeong Lee, Suwon-si (KR); Songwon Hyun, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 625 days.

This patent is subject to a terminal disclaimer.

(21) Appl. No.: 16/898,761

(22) Filed: Jun. 11, 2020

(65) Prior Publication Data
US 2021/0147612 A1    May 20, 2021

(30) Foreign Application Priority Data
Nov. 14, 2019  (KR) .................. 10-2019-0146181

(51) Int. Cl.
*C08G 59/24* (2006.01)
*C08G 59/26* (2006.01)
(Continued)

(52) U.S. Cl.
CPC .......... *C08G 59/245* (2013.01); *C08G 59/26* (2013.01); *C08G 59/621* (2013.01); *C08L 63/00* (2013.01);
(Continued)

(58) Field of Classification Search
CPC .... C08G 59/245; C08G 59/26; C08G 59/621; C08L 63/00; C09D 5/00; C09D 163/00;
(Continued)

(56) References Cited

U.S. PATENT DOCUMENTS

| 5,811,504 A | 9/1998 | Shiota et al. |
| 9,390,990 B2 | 7/2016 | Ji et al. |

(Continued)

FOREIGN PATENT DOCUMENTS

| CN | 103059036 A | 4/2013 |
| CN | 106810863 A | 6/2017 |

(Continued)

OTHER PUBLICATIONS

Yasuda et al., JP 2011-153268 A machine translation in English, Aug. 11, 2011 (Year: 2011).*

(Continued)

*Primary Examiner* — David T Karst
(74) *Attorney, Agent, or Firm* — CANTOR COLBURN LLP

(57) ABSTRACT

A high-thermal conductive epoxy compound and a composition, a material for a semiconductor package, a molded product, an electric and electronic device, and a semiconductor package including the epoxy compound. The epoxy compound has a structure represented by Formula 1.

$$E1\text{-}M1_p\text{-}L1_x\text{-}M2_q\text{-}L2_y\text{-}M3_r\text{-}L3_z\text{-}A\text{-}L3_z\text{-}M3_r\text{-}L2_y\text{-}M2_q\text{-}L1_x\text{-}M1_p\text{-}E2 \quad \text{Formula 1}$$

(Continued)

In Formula 1, M1, M2, M3, L1, L2, L3, A, E, p, q, r, x, y, and z are the same as defined in the detailed description.

22 Claims, 7 Drawing Sheets

(51) Int. Cl.
| | | |
|---|---|---|
| *C08G 59/62* | (2006.01) | |
| *C08L 63/00* | (2006.01) | |
| *C09D 5/00* | (2006.01) | |
| *C09D 163/00* | (2006.01) | |
| *C09K 5/14* | (2006.01) | |
| *H01L 33/56* | (2010.01) | |
| *H01L 33/62* | (2010.01) | |
| *H01L 33/64* | (2010.01) | |

(52) U.S. Cl.
CPC .............. *C09D 5/00* (2013.01); *C09D 163/00* (2013.01); *C09K 5/14* (2013.01); *H01L 33/56* (2013.01); *H01L 33/62* (2013.01); *H01L 33/641* (2013.01)

(58) Field of Classification Search
CPC ........... C09K 5/14; H01L 33/56; H01L 33/62; H01L 33/641
USPC ........................................................ 523/400
See application file for complete search history.

(56) References Cited

U.S. PATENT DOCUMENTS

| | | | |
|---|---|---|---|
| 9,617,476 B2 | 4/2017 | Chen et al. | |
| 2009/0253887 A1* | 10/2009 | Mori ................. | C08G 59/4014 |
| | | | 548/219 |
| 2010/0117027 A1 | 5/2010 | Hirai et al. | |
| 2021/0147613 A1 | 5/2021 | Won et al. | |

FOREIGN PATENT DOCUMENTS

| | | | | |
|---|---|---|---|---|
| EP | 0724006 A1 | | 7/1996 | |
| JP | 1997118673 A | | 5/1997 | |
| JP | 2010196016 A | * | 9/2010 | |
| JP | 2011153268 A | | 8/2011 | |
| JP | 2012131960 A | * | 7/2012 | ............. C07C 69/94 |
| KR | 1020120100506 A | | 9/2012 | |
| KR | 1020150014214 A | | 2/2015 | |
| KR | 1020190015428 A | | 2/2019 | |
| KR | 1020210058453 A | | 5/2021 | |
| WO | 2014201997 A1 | | 12/2014 | |

OTHER PUBLICATIONS

Mimura et al., JP 2010-196016 A machine translation in English, Sep. 9, 2010 (Year: 2010).*
Asaumi et al., JP 2012-131960 A machine translation in English, Jul. 12, 2012 (Year: 2012).*
English Abstract of CN 103059036.
English Abstract of CN 106810863.
English Abstract of JP 2011-153268.
English Abstract of KR10-2012-0100506.

* cited by examiner

HIGH-THERMAL CONDUCTIVE EPOXY COMPOUND AND COMPOSITION, MATERIAL FOR SEMICONDUCTOR PACKAGE, MOLDED PRODUCT, ELECTRIC AND ELECTRONIC DEVICE, AND SEMICONDUCTOR PACKAGE INCLUDING THE SAME

CROSS-REFERENCE TO RELATED APPLICATION

This application claims priority to Korean Patent Application No. 10-2019-0146181, filed on Nov. 14, 2019, in the Korean Intellectual Property Office, and all benefits accruing therefrom under 35 U.S.C. § 119, the content of which in its entirety is herein incorporated by reference.

BACKGROUND

1. Field

This disclosure relates to a highly thermally conductive epoxy compound, referred to hereinafter as a "high-thermal conductive compound". This disclosure further relates to a composition, a material for a semiconductor package, a molded product, an electric and electronic device, and a semiconductor package including the high-thermal conductive epoxy compound. The high-thermal conductive epoxy compound and a composition, a material for a semiconductor package, a molded product, an electric and electronic device, and a semiconductor package including the high-thermal conductive epoxy compound may be applied to various electric and electronic fields that require characteristics of heat-radiation dissipation.

2. Description of the Related Art

In accordance with the development of electronic devices, semiconductors have become lighter, thinner, and smaller in dimensional size, and therefore, semiconductor circuits have necessarily become more complicated with greater circuit density. Following this trend, electrical, thermal, and mechanical stability of molding materials become an ever more important factor. In particular, heat that is generated in an operating application processor (AP) of a mobile device product, and the inability to dissipate that heat in an efficient manner, may have a significant influence on performance and reliability of the mobile device product.

A molding process, e.g., a process of sealing a semiconductor with a mold compound such as in a semiconductor package molding method is of continuing interest. The molding material protects semiconductor chips from external environments, and may provide an electrical insulation effect as well as transfer or direct heat away from an operating chip. The molding material may protect a semiconductor chip that includes wire bonding or flip chip bonding from electrical deterioration. Electrical deterioration may be due to various factors such as corrosion by exposure to air (oxygen) or other oxidizing external contaminants. The molding material may also provide the necessary mechanical stability as well as effectively transfer or direct heat away from the semiconductor chip during operation.

In general, an epoxy molding compound (EMC), which is a thermosetting resin, is used as a component of molding material of a semiconductor package. However, the epoxy molding compound has limitations in terms of coefficient of thermal expansion (CTE), warpage, and thermal conductivity. To address some or many of such limitations, relatively large amounts of a high-thermal conductive inorganic filler is often added to the EMC. However, an increase in the thermal conductivity of a composite material has a limit even if the thermal conductivity of the high-thermal conductive inorganic filler is increased to 100 W/mK or greater. The thermal conductivity of the EMC may not generally exceed 5 W/mK even if 90% or more of a filler is present in the EMC. Moreover, as the filler loading content increases, one may exhibit an increase degradation of mechanical properties. Accordingly, a molding compound which is capable of achieving high thermal conductivity, and also limits or minimizes the amount of inorganic filler in an EMC composition is of interest.

In this regard, the development or improvement of a high-thermal conductive molding material that is applicable to the semiconductor and electronic device fields with heat dissipating properties is greatly sought and necessary.

SUMMARY

Provided are high-thermal conductive epoxy compounds having relatively high heat-radiation characteristics.

Provided are compositions including the high-thermal conductive epoxy compounds.

Provided are materials for a semiconductor package, the materials including the high-thermal conductive epoxy compounds.

Provided are molded products by using the high-thermal conductive epoxy compounds.

Provided are electric and electronic devices including the high-thermal conductive epoxy compounds.

Provided are semiconductor packages including the high-thermal conductive epoxy compounds.

Additional aspects will be set forth in part in the description which follows and, in part, will be apparent from the description, or may be learned by practice of the presented embodiments of the disclosure.

According to an aspect of an embodiment, an epoxy compound is represented by Formula 1.

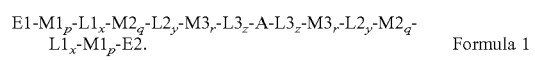

Formula 1

In Formula 1,

M1, M2, and M3 are each independently a mesogenic unit represented by Formula 2, and each p, each q, and each r, are independently 0 or 1, wherein at least one of p, q, and r is 1;

L1, L2, and L3 are each independently —O—, —C(=O)O—, —O—C(=O)O—, —(CH$_2$)$_2$—C(=O)—, —CH=CH—C(=O)—, —S(=O)—, —CH=N—, —NHC(=O)O—, —C(=O)NH—, —OC(=O)NHS(=O)O—, or —CH$_2$(CH$_4$)C(=O)—, and x, y, and z are each independently 0 or 1;

A is a spacer, which is a substituted or unsubstituted C1-C12 alkylene group, a substituted or unsubstituted C2-C12 alkenylene group, a substituted or unsubstituted C2-C12 alkynylene group, a substituted or unsubstituted C6-C12 arylene group, or a substituted or unsubstituted C4-C12 heteroarylene group; and E1 and E2 are the same or different epoxy-containing group.

Formula 2
(2-1) 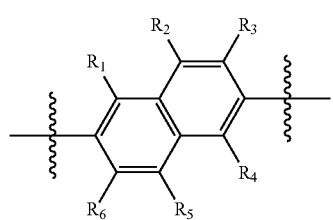
(2-2) 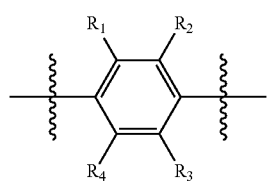
(2-3) 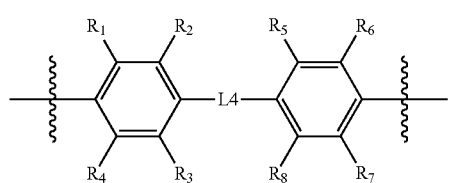
(2-4) 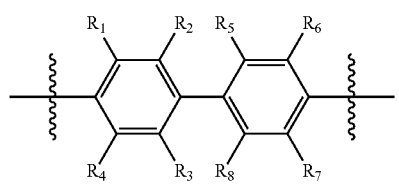
(2-5) 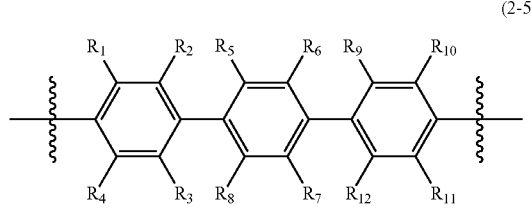
(2-6) 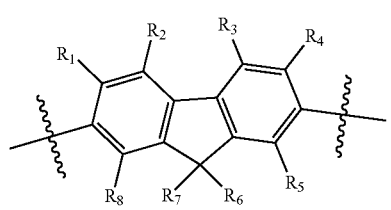
(2-7) 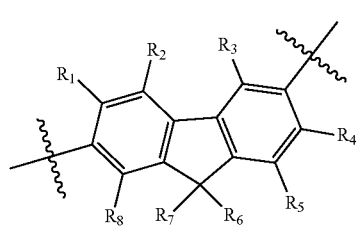
(2-8) 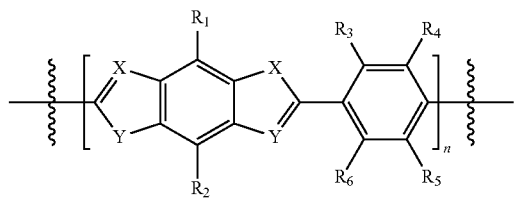
(2-9) 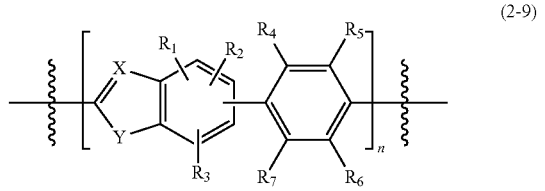
(2-10) 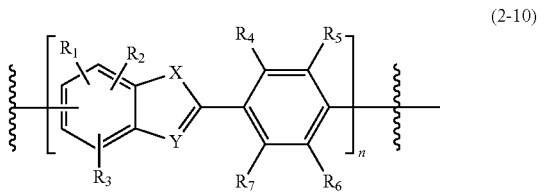
(2-11) 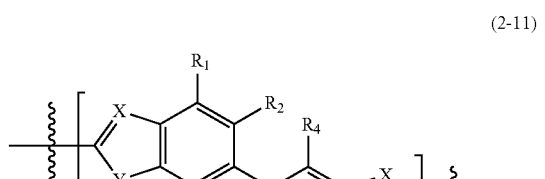
(2-12) 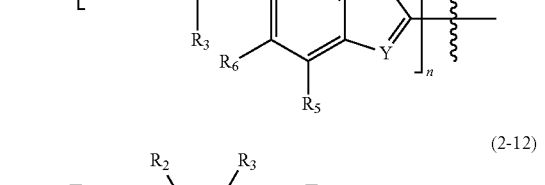
(2-13) 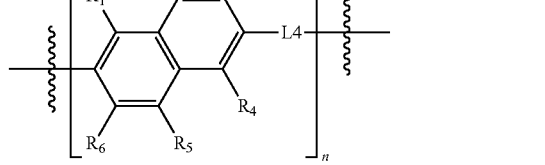
(2-14) 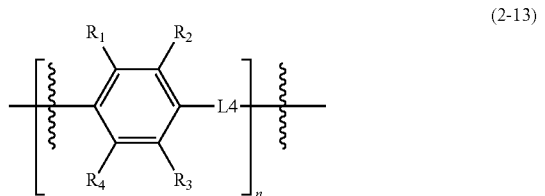
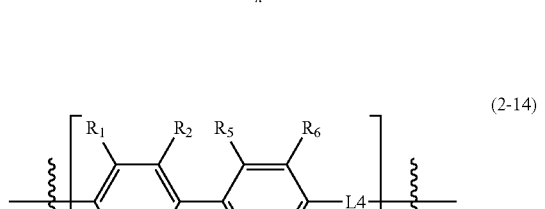

-continued (2-15)

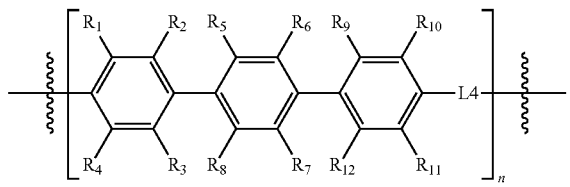

In Formula 2, $R_1$ to $R_{12}$ are each independently a hydrogen atom, a halogen atom, a C1-C30 alkyl group, a C2-C30 alkenyl group, a C2-C30 alkynyl group, a C1-C30 alkoxy group, a C2-C30 alkoxyalkyl group, a C1-C30 heteroalkyl group, a C6-C30 aryl group, a C7-C30 arylalkyl group, a C2-C30 heteroaryl group, a C3-C30 heteroarylalkyl group, a C2-C30 heteroaryloxy group, a C3-C30 heteroaryloxyalkyl group, a C6-C30 heteroarylalkyloxy group, a hydroxy group, a nitro group, a cyano group, an amino group, an amidino group, a hydrazine group, a hydrazone group, a carboxyl group or a salt thereof, a sulfonyl group, a sulfamoyl group, a sulfonic acid or a salt thereof, or a phosphoric acid or a salt thereof;

L4 is —O—, —C(═O)O—, —O—C(═O)O—, —(CH$_2$)$_2$—C(═O)—, —CH═CH—C(═O)—, —S(═O)—, —CH═N—, —NHC(═O)O—, —C(═O)NH—, —OC(═O)NHS(═O)O—, or —CH$_2$(CsH$_4$)C(═O)—; and X is N, P, or As, Y is O, S, or Se, and n is an integer of 1 to 10.

According to another aspect of an embodiment, a composition includes the epoxy compound.

According to another aspect of an embodiment, a material for a semiconductor package includes the epoxy compound.

According to another aspect of an embodiment, a molded product includes the epoxy compound or its cured product.

According to another aspect of an embodiment, an electric and electronic device includes the epoxy compound or its cured product.

According to another aspect of an embodiment, a semiconductor package includes a substrate; at least one chip mounted on the substrate; a connecting portion for electrically connecting the at least one chip and the substrate; and a molding portion encapsulating the at least one chip on the substrate, wherein the molding portion is formed by using the composition.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
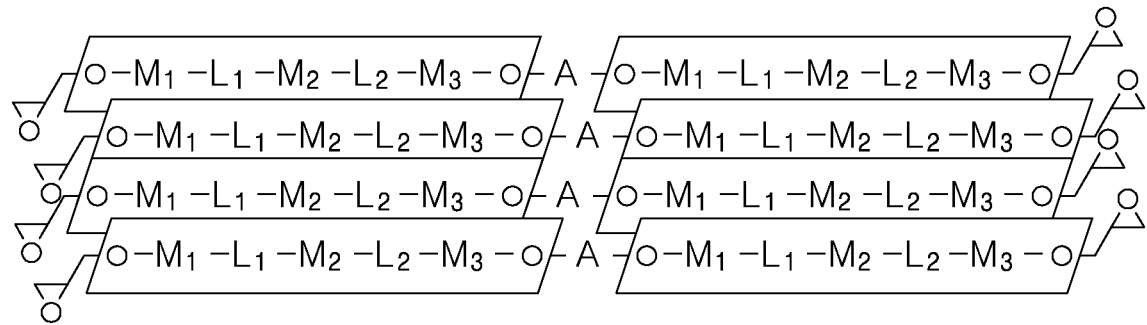
FIG. 1 is a schematic view illustrating a molecular design principle of an epoxy compound according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects.

As used herein, the term "and/or" includes any and all combinations of one or more of the associated listed items. Expressions such as "at least one of," when preceding a list of elements, modify the entire list of elements and do not modify the individual elements of the list.

The present inventive concept described below may be modified in various forms and have many embodiments, and particular embodiments will be illustrated in the drawings and described in detail in the written description. However, this is not intended to limit the present inventive concept to particular modes of practice, and it is to be appreciated that all changes, equivalents, and substitutes that do not depart from the spirit and technical scope are encompassed in the present inventive concept.

The terms used herein are merely used to describe particular embodiments, and are not intended to limit the present inventive concept. An expression used in the singular encompasses the expression of the plural, unless it has a clearly different meaning in the context. As used herein, it is to be understood that the terms such as "including," "having," and "comprising" are intended to indicate the existence of the features, numbers, steps, actions, components, parts, ingredients, materials, or combinations thereof disclosed in the specification, and are not intended to preclude the possibility that one or more other features, numbers, steps, actions, components, parts, ingredients, materials, or combinations thereof may exist or may be added.

In the drawings, the thicknesses of layers and regions are exaggerated or reduced for clarity. Like reference numerals in the drawings denote like elements, and thus their description will be omitted. Throughout the specification, it will be understood that when an element, such as a layer, a film, a region, or a plate, is referred to as being "on" another component, the element may be directly on the other element or intervening elements may be present therebetween. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, according to example embodiments, a material for a semiconductor package, a molding composition for a semiconductor package, and a semiconductor package using the material and the molding composition will be described in detail.

In related art, there are operational limitations to increasing the thermal conductivity of a filler, and although the thermal conductivity of a filler may be as high as about 100 Watts per meter Kelvin (W/mK), it can be very difficult, if not nearly impossible, to achieve a thermal conductivity of a final composite material of about 5 W/mK or greater.

Figure 2:
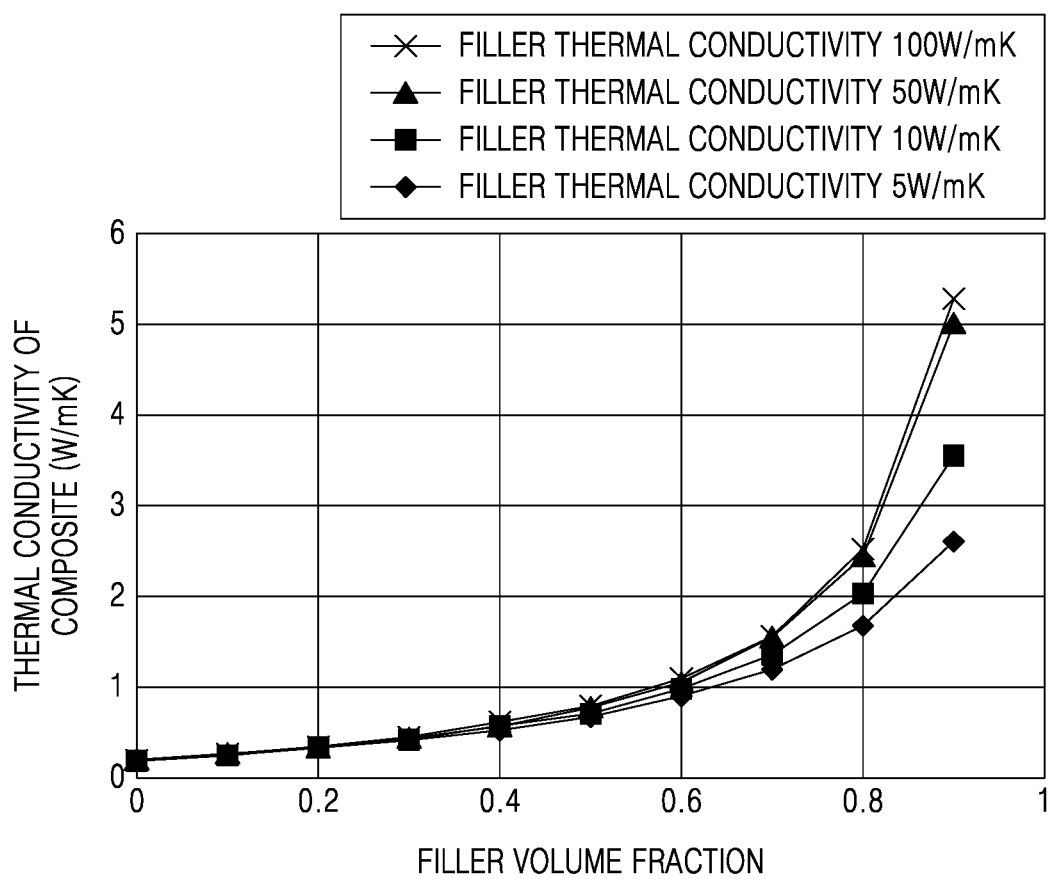
FIG. 2 is a graph that shows changes in thermal conductivity of a composite material according to thermal conductivity of a filler.

FIG. 2 is a graph showing the thermal conductivity change of a composite material in accordance with the thermal conductivity of a filler. The FIG. 2 plots of thermal conductivity are calculated based on Maxwell Model as the filler content is increased from 0% by volume to 90% by volume in a commonly used polymer resin having a thermal conductivity of about 0.2 W/mK. As shown in the plots, it is confirmed that if the filler content is about 90%, there is little, if any, difference in the thermal conductivity of a final composite material if one was to use a filler with a thermal conductivity of about 50 W/mK or greater.

A polymer material may be a thermal insulator and is known to have a bulk thermal conductivity of about 0.2 W/mK or less, for example, in a range of about 0.1 W/mK to about 0.3 W/mK, or about 0.1 W/mK to about 0.2 W/mK, in case of a thermosetting polymer which may be used as a material for a semiconductor package.

In the case of an insulating polymer, because heat transfer is in-part governed by the vibration transfer of phonons, a polymer that maximizes the path of the phonons and minimizes the scattering of the phonons may enhance the heat transfer characteristics of the polymer, and therefore, reduce the insulating effectiveness of the polymer.

Figure 3:
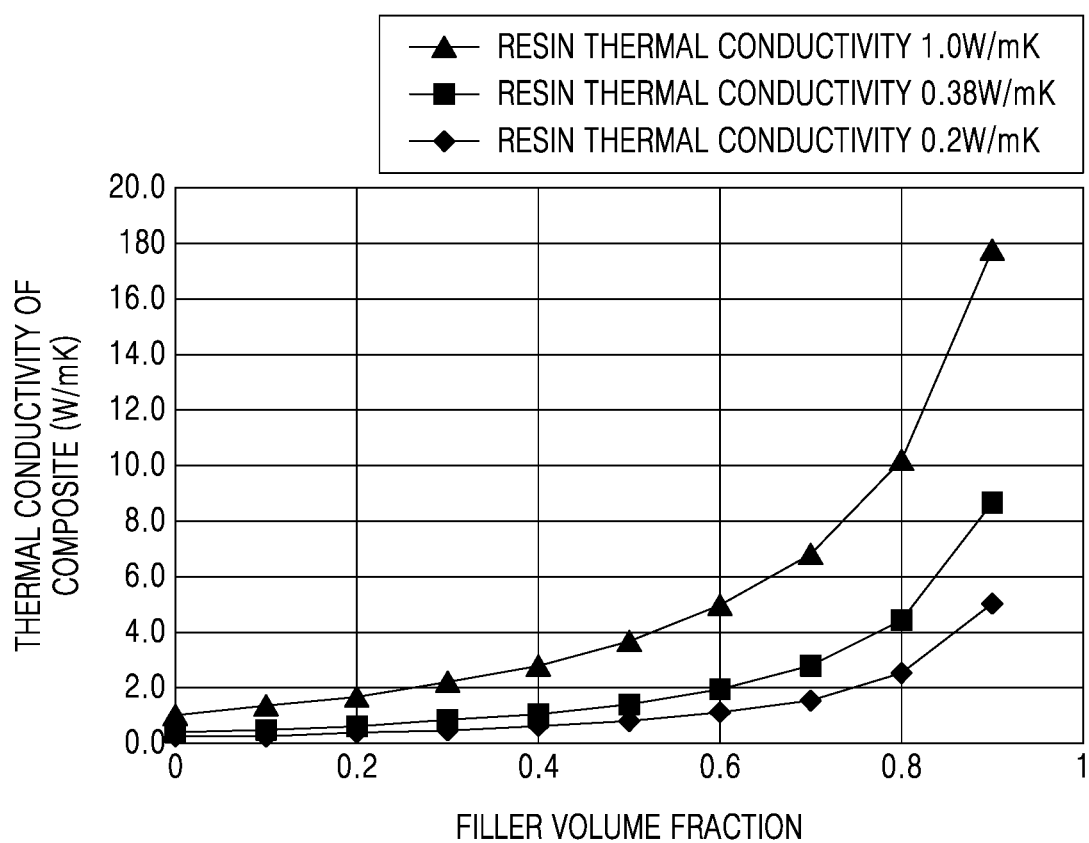
FIG. 3 is a graph that shows a change in a thermal conductivity of the composite material according to a thermal conductivity of a polymer.

FIG. 3 is a graph that shows a change in a thermal conductivity of a composite material (polymer plus filler) in accordance with the thermal conductivity of a polymer. The data plots, which are based on Maxwell model, depict changes in thermal conductivity values of a composite material for a given filler with a thermal conductivity of 50 W/mK ($Al_2O_3$), as the thermal conductivity of the polymer is increased from about 0.2 W/mK to about to 1.0 W/mK. In reference to FIG. 3, which is different from the case of increasing the thermal conductivity of the filler (see FIG. 2), we confirm that if the thermal conductivity of the polymer is increased from about 0.2 W/mK to about to 1.0 W/mK, the thermal conductivity of the composite material may increase up to 18 W/mK with a filler content of 90%.

In this regard, we realized that one may increase thermal conductivity of a composite material by select design of the path of phonons through π-π stacking, e.g., by introducing a r-conjugation using a mesogenic unit to the main chain structure of a thermosetting epoxy compound, which is believed to enhance chain stiffness. Also, a melting temperature may be controlled and set to an adjustable level by introducing a flexible spacer between the mesogenic units.

According to an embodiment, an epoxy compound is represented by Formula 1.

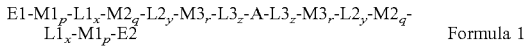

Formula 1

In Formula 1,

M1, M2, and M3 are each independently a mesogenic unit represented by Formula 2, and p, q, and r are each independently 0 or 1, wherein at least one of p, q, and r is 1;

L1, L2, and L3 are each independently —O—, —C(=O)O—, —O—C(=O)O—, —(CH$_2$)$_2$—C(=O)—, —CH=CH—C(=O)—, —S(=O)—, —CH=N—, —NHC(=O)O—, —C(=O)NH—, —OC(=O)NHS(=O)O—, or —CH$_2$(C$_6$H$_4$)C(=O)—, wherein x, y, and z are each independently 0 or 1;

A is a spacer, which is a substituted or unsubstituted C1-C12 alkylene group, a substituted or unsubstituted C2-C12 alkenylene group, a substituted or unsubstituted C2-C12 alkynylene group, a substituted or unsubstituted C6-C12 arylene group, or a substituted or unsubstituted C4-C12 heteroarylene group; and E1 and E2 are the same or different epoxy-containing group;

Formula 2

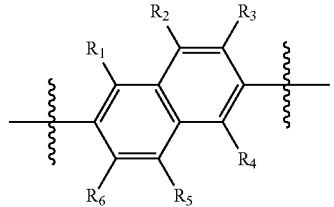

(2-1)

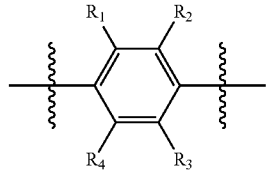

(2-2)

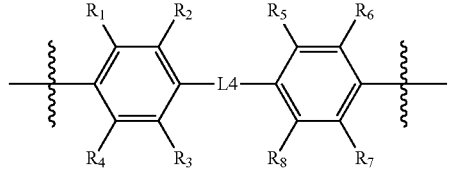

(2-3)

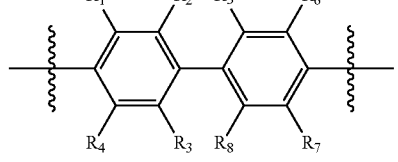

(2-4)

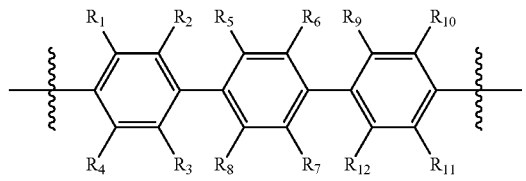

(2-5)

-continued

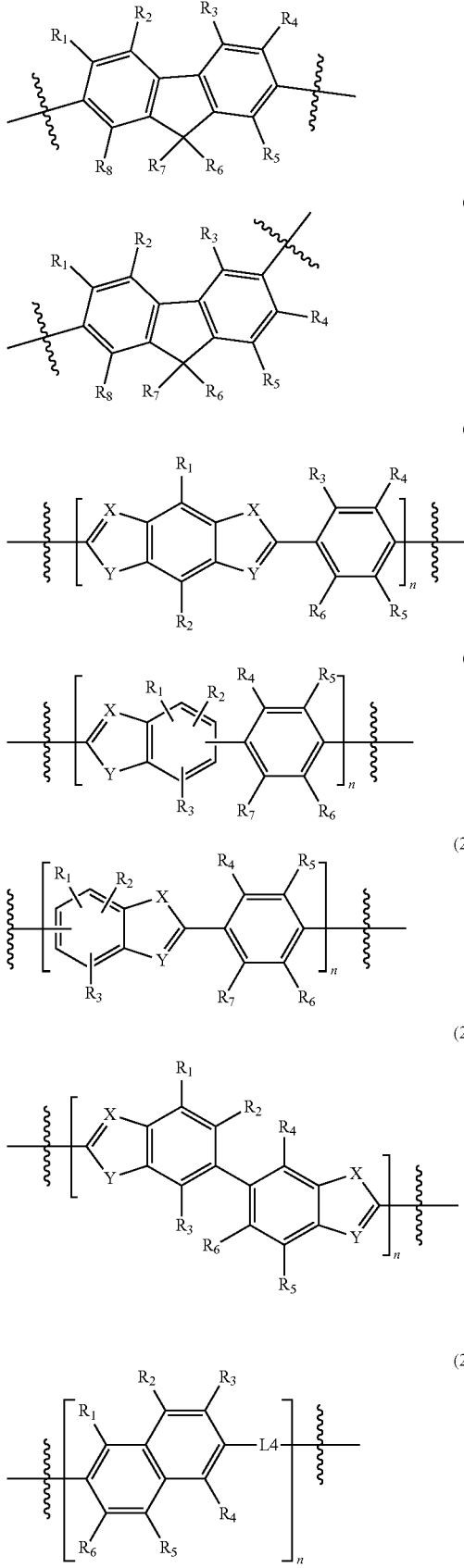

(2-6)
(2-7)
(2-8)
(2-9)
(2-10)
(2-11)
(2-12)

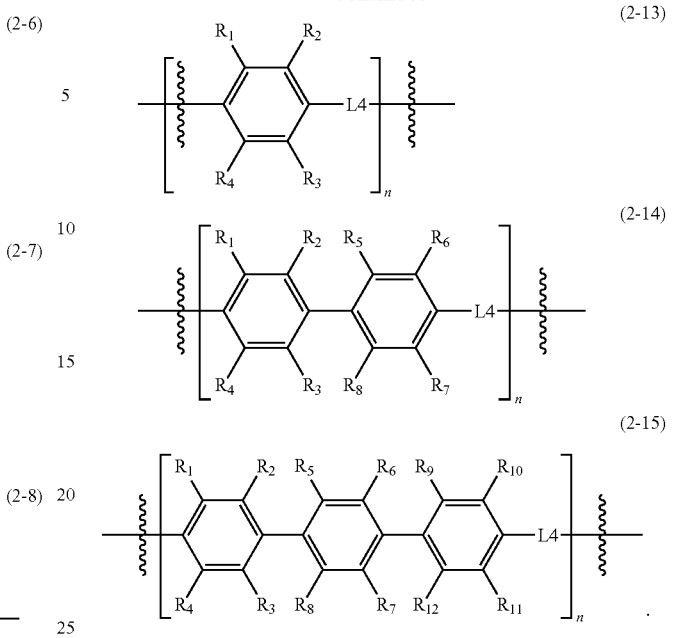

(2-13)
(2-14)
(2-15)

In Formula 2, $R_1$ to $R_{12}$ are each independently a hydrogen atom, a halogen atom, a C1-C30 alkyl group, a C2-C30 alkenyl group, a C2-C30 alkynyl group, a C1-C30 alkoxy group, a C2-C30 alkoxyalkyl group, a C1-C30 heteroalkyl group, a C6-C30 aryl group, a C7-C30 arylalkyl group, a C2-C30 heteroaryl group, a C3-C30 heteroarylalkyl group, a C2-C30 heteroaryloxy group, a C3-C30 heteroaryloxyalkyl group, a C6-C30 heteroarylalkyloxy group, a hydroxy group, a nitro group, a cyano group, an amino group, an amidino group, a hydrazine group, a hydrazone group, a carboxyl group or a salt thereof, a sulfonyl group, a sulfamoyl group, a sulfonic acid or a salt thereof, or a phosphoric acid or a salt thereof; L4 of Formula 2-12 to 2-15 is —O—, —C(=O)O—, —O—C(=O)O—, —(CH$_2$)$_2$—C(=O)—, —CH=CH—C(=O)—, —S(=O)—, —CH=N—, —NHC(=O)O—, —C(=O)NH—, —OC(=O)NHS(=O)O—, or —CH$_2$(C6H4)C(=O)—; and X is N, P, or As, Y is O, S, or Se, and n is an integer of 1 to 10, or from 1 to 8, or from 2 to 6.

In an exemplary embodiment, Formula 1, groups L1, L2, and L3 may be C2 symmetrical about A.

FIG. 1 is a schematic view illustrating a molecular design principle of an epoxy compound according to an embodiment. Referring to FIG. 1, the epoxy compound according to an embodiment may have a twin structure in which a mesogenic unit is introduced in a main chain structure, and the same mesogenic units are symmetrically and linearly connected at both sides of a spacer A.

Alternatively, the epoxy compound according to an embodiment may have an asymmetric structure about spacer A. For example, the epoxy compound of Formula 1 may have different mesogenic units of Formula 2, or different number of mesogenic units, on either side of spacer A.

The epoxy compound according to an embodiment may have π-π stacking between the epoxy compounds through r-conjugation by introducing select mesogenic units in the main chain structure of the epoxy compound. In this regard, the epoxy compound may form a resin cured product of an aligned structure through a strong interaction between the mesogenic units. Moreover, phonon vibration transfer between the mesogenic units is more likely to proceed in the same direction with little, if any, scattering at a high-crystalline region of the aligned structure, and with a shortened free path of phonons. The result of which may be an improvement in thermal conductivity of the epoxy compound by active heat transfer.

Also, flexibility may be imparted to the epoxy compounds described herein through the introduction of a spacer between the two regions of mesogenic units, which can be the same or different, and thus a melting temperature of the epoxy compound may be controlled or adjusted to a processable level.

In the epoxy compound, the mesogenic unit refers to a functional group that may exhibit a liquid crystallinity in an epoxy compound described. The three mesogenic units M1, M2, and M3 in Formula 1, which are the same or different, and are each independently a mesogenic unit represented by Formula 2. In Formula 1, at least one mesogenic unit of M1, M2, or M3 is present. In Formula 2,

refers to a connection point to another linking group such as L1, L2 or L2, or an epoxy-containing group.

In some embodiments, the epoxy compound may have at least one of the three mesogenic units M1, M2, or M3, that is a naphthalene unit represented by Formula 2-1 in Formula 2.

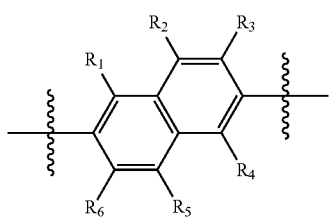

(2-1)

The term "naphthalene unit" refers to a bivalent naphthyl group that is unsubstituted or substituted with one to six hydrogens replaced with a substituent as defined herein. Moreover, each ring of the naphthyl group accounts for one of the bivalent connective points to an adjacent mesogenic unit or epoxy-containing compound (terminal group).

If the epoxy compound includes at least one naphthalene unit, the π-π stacking effect between the epoxy compounds may increase, which enhances an interaction between the mesogenic units between adjacent epoxy compounds in the stacked or aligned state, and thus stacking and aligning of molecules may further improve. Accordingly, the epoxy compound may further enhance the heat transfer between intermolecular mesogenic units to improve thermal conductivity. Of the cured epoxy compound.

In Formula 2, $R_1$ to $R_{12}$ are each independently a hydrogen atom, a halogen atom, a C1-C30 alkyl group, a C2-C30 alkenyl group, a C2-C30 alkynyl group, a C1-C30 alkoxy group, a C2-C30 alkoxyalkyl group, a C1-C30 heteroalkyl group, a C6-C30 aryl group, a C7-C30 arylalkyl group, a C2-C30 heteroaryl group, a C3-C30 heteroarylalkyl group, a C2-C30 heteroaryloxy group, a C3-C30 heteroaryloxyalkyl group, a C6-C30 heteroarylalkyloxy group, a hydroxy group, a nitro group, a cyano group, an amino group, an amidino group, a hydrazine group, a hydrazone group, a carboxyl group or a salt thereof, a sulfonyl group, a sulfamoyl group, a sulfonic acid or a salt thereof, or a phosphoric acid or a salt thereof. For example, $R_1$ to $R_{12}$ are each independently a hydrogen atom, a C1-C10 alkyl group, a C2-C10 alkenyl group, a C2-C10 alkynyl group, a C1-C30 alkoxy group, a C2-C30 alkoxyalkyl group, or a C1-C30 heteroalkyl group, and, in particular, for example, a hydrogen atom or a C1-C10 alkyl group.

According to an embodiment, at least six of $R_1$ to $R_{12}$, preferably, at least eight of $R_1$ to $R_{12}$, are a hydrogen atom, i.e. not substituted. Still in another embodiment, $R_1$ to $R_{12}$ are each hydrogen. The smaller the size or number of the substituents of $R_1$ to $R_{12}$, the greater opportunity for the arranged stacking of the epoxy compound, e.g., the π-π stacking of adjacent epoxy compounds.

In some embodiments, the mesogenic units may be at least one of the following of Formula 2a.

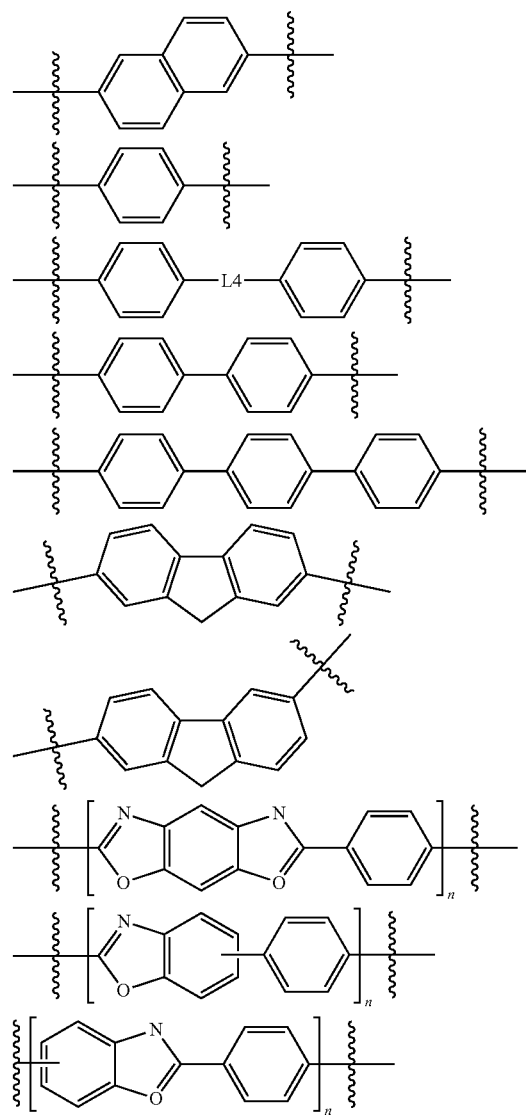

Formula 2a

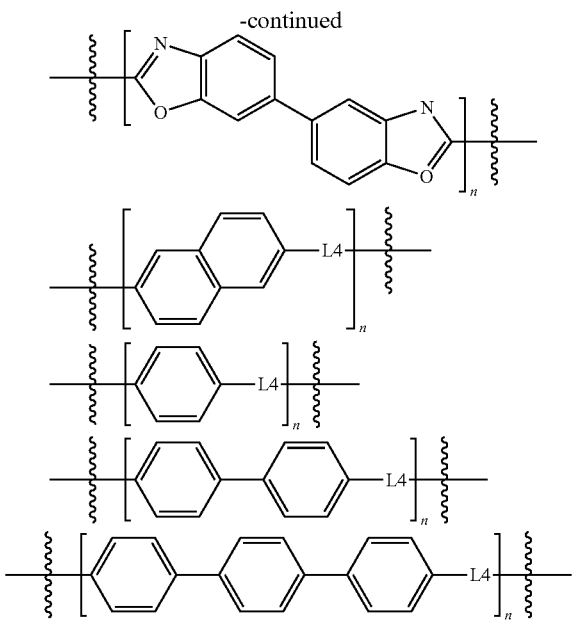

In Formula 2a, L4 is —O—, —C(=O)O—, —O—C(=O)O—, —(CH$_2$)$_2$—C(=O)—, —CH=CH—C(=O)—, —S(=O)—, —CH=N—, —NHC(=O)O—, —C(=O)NH—, —OC(=O)NHS(=O)O—, or —CH$_2$(C$_6$H$_4$)C(=O)—, and n is an integer of 1 to 10.

According to an embodiment, in the epoxy compound of Chemical Formula 1, M$_1$ and M$_3$ may be the same mesogenic unit.

For example, the epoxy compound may have at least one of M1 or M3 in Formula 1 that is a naphthalene unit, and M2 would be a mesogenic unit of Formula 2 that does not include a naphthalene unit. In the epoxy compound, if M1 and M3 have the same mesogenic unit, particularly, a naphthalene unit, the resulting structure may result in an increase in symmetry. Moreover, the symmetric structure may provide an increase in the overall π-π stacking of adjacent epoxy compounds, i.e., a stronger stacking interaction, and thus, a more regular or consistent molecular alignment, and a further increase in thermal conductivity.

In some embodiments, a M1$_p$-L1$_c$M2$_q$-L2$_y$-M3$_r$ region in Formula 1 may be at least one structure represented by Formula 3.

Formula 3

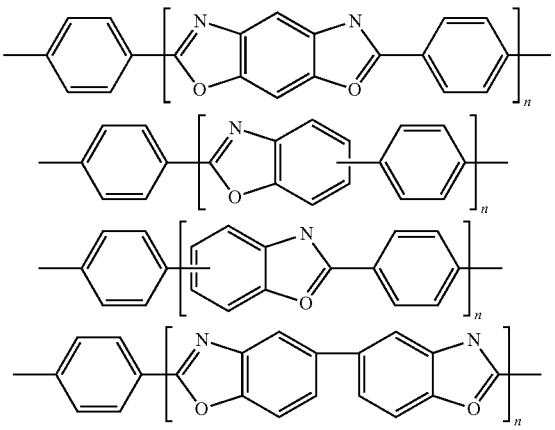

In Formula 3, n is an integer of 1 to 10, or from 1 to 8, or from 2 to 6.

In some embodiments, the M1$_p$-L1$_c$-M2$_q$-L2$_y$-M3$_r$ region in Formula 1 may be a structure represented by Formula 4.

Formula 4

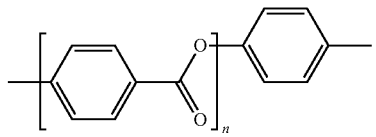

In Formula 4, n is an integer of 2 to 10, or from 2 to 8, or from 4 to 8.

The epoxy compound including a structure represented by Formula 3 or Formula 4 and may effectively exhibit overall π-π stacking of the epoxy compound, if n is within the above ranges, the epoxy compound may have a high thermal conductivity and an appropriate melting temperature and thus exhibit excellent processability.

In some embodiments, the epoxy compound may have M1 and M3 in Formula 1 that are the same mesogenic units on one or both sides of the spacer A.

For example, the epoxy compound may have M1 or M3, or both M1 and M3, in Formula 1 as a naphthalene unit, and M2 that is a mesogenic unit of Formula 2, but does not include a naphthalene unit.

In the epoxy compound, if M1 and M3 have the same mesogenic unit, particularly, a naphthalene unit, the resulting structure may result in an increase in symmetry. Moreover, the symmetric structure may provide an increase in the overall π-π stacking of adjacent epoxy compounds, i.e., a stronger stacking interaction, or a more regular or consistent molecular alignment, and therefore, an even greater increase in thermal conductivity.

In some embodiments, the total length of the mesogenic unit may be at least about 10 Å. For example, the length of the mesogenic unit may be at least about 10 Å, at least about 15 Å, at least about 20 Å, at least about 25 Å, at least about 30 Å, at least about 35 Å, or at least about 40 Å. In particular, for example, the length of the mesogenic unit may be in a range of about 10 Å to about 40 Å. If the total length of the mesogenic unit is within this range, a melting temperature of the epoxy compound may be controlled to a processable temperature of about 190° C. or lower.

In an embodiment of an epoxy compound of Formula 1, A is a spacer, which is located in the center of a molecular structure of a twin mesogenic unit (region) structure, and the mesogenic unit and an epoxy group are connected in a straight line in both directions through the spacer A. Because the intermolecular interactions, e.g., the π-π stacking interaction, between adjacent mesogenic units of stacked epoxy compounds in a resin cured product is not expected to be effected or weakened, the thermal conductivity of the cured resin may exhibit improved active heat transfer between the neighboring mesogenic units.

In Formula 1, A is, for example, a substituted or unsubstituted C1-C9 alkylene group, a substituted or unsubstituted C2-C9 alkenylene group, a substituted or unsubstituted C2-C9 alkynylene group, a substituted or unsubstituted C6-C9 arylene group, or a substituted or unsubstituted C4-C9 heteroarylene group. The spacer A may be, for example, —(CH$_2$)$_n$—, —(CF$_2$)$_n$—, —(C$_2$H$_4$)$_n$—, or —(C$_2$F$_4$)$_n$—, wherein n is an integer of 1 to 9, or from 2 to 8, or from 4 to 8. The mesogenic units may be connected to the spacer A through a linker L3.

In Formula 1, epoxy-containing groups, E1 and E2, which can be the same or different, are located at a terminal end of each mesogenic unit of the epoxy compound. If the epoxy-containing group is located at both ends of the mesogenic unit rather than as a side chain of a mesogenic unit, a structure advantageous for π-π stacking is formed.

The epoxy-containing groups E1 and E2 includes an epoxy group that denotes —O— binding to two carbons bonded to both carbon chains, and, in some embodiments, the epoxy-containing group in the epoxy compounds of Formula 1 is independently represented by a group of Formula 5.

Formula 5

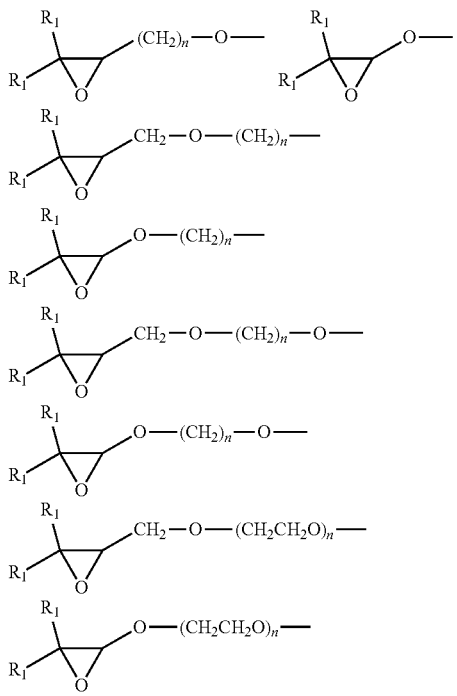

In Formula 5, $R_1$ and $R_2$ are each independently a hydrogen atom, a C1-C10 alkyl group, a C2-C10 alkenyl group, a C2-C10 alkynyl group, a C1-C30 alkoxy group, a C2-C30 alkoxyalkyl group, or a C1-C30 heteroalkyl group, and n is an integer of 1 to 10.

For example, the epoxy-containing group groups, E1 and E2, are each independently represented by a group of Formula 5a, but embodiments are not limited thereto.

Formula 5a

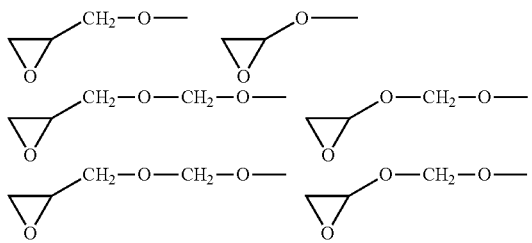

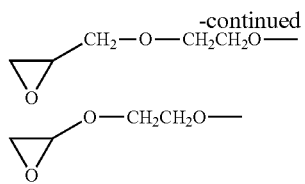

According to an embodiment, a melting temperature of the epoxy compound may be about 190° C. or less, e.g., about 150° C. to about 190° C. such as about 160° C. to 180° C. If the melting temperature of the epoxy compound is within this range, the epoxy compound may exhibit acceptable processability.

In some embodiments, a thermal conductivity of the epoxy compound may be about 0.4 W/mK or greater, e.g., from 0.4 W/mK to about 50 W/mK, or from 0.4 W/mK to about 30 W/mK, or from 2 W/mK to about 20 W/mK. If the epoxy compound has a high thermal conductivity within this range, the epoxy compound may exhibit high heat-radiation characteristics and may form a composite material having a high thermal conductivity even if the composite material includes relatively small amounts of a filler.

According to another embodiment, a composition includes the epoxy compound.

If the composition includes the epoxy compound having a high thermal conductivity, the composition may be applied to various electrical and electronical fields requiring heat-radiation characteristics as well as to a semiconductor.

The composition may further include a filler. Here, the filler may include an inorganic material, an organic material, or a combination thereof.

When the filler include an inorganic material, examples of the inorganic material forming the filler may include at least one selected from silicon oxide, calcium carbonate, magnesium carbonate, alumina, magnesia, clay, titania, talc, calcium silicate, antimony oxide, glass fibers, or a eucryptite ceramic, but embodiments are not limited thereto. The eucryptite ceramic is crystallized glass formed of components of $Li_2O$, $Al_2O_3$, and $SiO_2$.

If the filler includes an organic material, examples of the organic material forming the filler may include at least one selected from polyethyleneimine, ethylene glycol, and polyethylene glycol, but embodiments are not limited thereto.

In some embodiments, the filler may be formed of an inorganic material in terms of having a high thermal conductivity, enhancing a rigidity of a material, and reducing a linear expansion coefficient.

According to an embodiment, an amount of the filler in the composition may be in a range of about 40 parts to about 99 parts by weight based on 100 parts by weight of the epoxy compound. For example, an amount of the filler may be in a range of about 50 parts to about 99 parts by weight, about 60 parts to about 99 parts by weight, about 70 parts to about 99 parts by weight, about 75 parts to about 99 parts by weight, or about 80 parts to about 99 parts by weight, based on 100 parts by weight of the epoxy compound. When the amount of the filler is within these ranges, physical properties such as molding properties, low-stress properties, high-temperature strength, rigidity, and a coefficient of thermal expansion may be achieved, maintained, or appropriately controlled.

The composition may further include at least one additive, for example, a curing agent, a curing accelerator, a reaction regulator, a release agent, a coupling agent, a stress relieving agent, or an auxiliary flame retardant, as needed.

In the case of a curing agent, for example, at least one selected from an amine curing agent, an acid anhydride curing agent, a polyamine curing agent, a polysulfide curing agent, a phenol novolak-type curing agent, a bisphenol A-type curing agent, and a dicyandiamide curing agent may be used.

Examples of the curing agent may include a phenolalkyl-type phenol resin, a phenol novolak-type phenol resin, a naphthol-type phenol resin, a polyfunctional-type phenol resin, a dicyclopentadiene-type phenol resin, an amine-type curing agent, an acid anhydride-type curing agent, a polyamine curing agent, a polysulfide curing agent, a bisphenol A-type curing agent, a novolak-type phenol resin, and aromatic amines such as diaminodifetylmethane and diaminodiphenylsulfone, or at least one or more selected from the above list of curing agents may be used.

The curing agent may be, for example, a polyfunctional phenol-type curing agent, and the polyfunctional phenol-type curing agent is a compound having at least three phenolic hydroxyl groups, which may have the following structure.

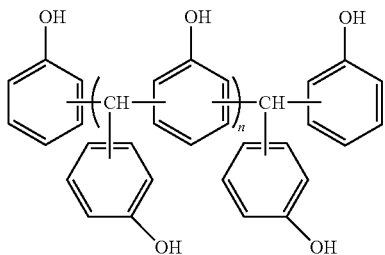

where n is an integer of 1 to 10000.

A number average molecular weight of the polyfunctional phenol-type curing agent may be, for example, in a range of about 40 grams per mole (g/mol) to about 30000 g/mol, for example, about 60 g/mol to about 10000 g/mol, or about 80 g/mol to about 10000 g/mol.

The amount the curing agent present in the composition may be in a range of about 0.1 parts to about 10 parts by weight based on 100 parts by weight of the composition, but embodiments are not limited thereto. If the amount of the curing agent is within this range, deterioration of insulating characteristics of a molding material may be prevented, e.g., by minimizing an amount of the unreacted curing agent while increasing the curing rate.

The composition may further include an epoxy resin used in the art, e.g., in the field of electronic packaging. If the composition further includes a common epoxy resin, a coefficient of thermal expansion, warpage, peel strength, and/or processing characteristics of the composition may further be improved.

Examples of the epoxy resin may include a biphenyl epoxy resin, a novolac epoxy resin, a dicyclopentadienyl epoxy resin, a bisphenol epoxy resin, a terpene epoxy resin, an aralkyl epoxy resin, a multi-functional epoxy resin, a naphthalene epoxy resin, and a halogenated epoxy resin. These epoxy resin may be used alone or in combination of two or more thereof.

An amount of the epoxy resin may be, for example, in a range of about 1 part to about 15 parts by weight based on 100 parts by weight of the composition, but embodiments are not limited thereto. If the amount of the epoxy resin is within this range, for example, an adhesive strength between a molding material and a substrate on a semiconductor package, a coefficient of thermal expansion, and processing characteristics may be improved.

In an embodiment, a method of preparing the composition may include homogenously mixing each component necessary for the composition by using a Henschel mixer or a Redige mixer, melt-mixing by using a roll mill or a kneader at a temperature in a range of about 90° C. to about 200° C., and then performing freezing and pulverizing processes.

A semiconductor package may be formed by using the composition.

A printed circuit board on which the semiconductor chip is mounted is encapsulated with a molding portion to protect the semiconductor chip from an external environment, give insulating characteristics, and effectively release heat during operation of the chip, and thus a semiconductor package may be formed.

Here, the molding portion may be formed by applying the molding composition according to an embodiment.

Also, the semiconductor packages formed by using the molding composition may be vertically connected through solder bumps that electrically connect semiconductor packages, and thus the semiconductor packages of a package-on-package type may be formed.

Figure 4:
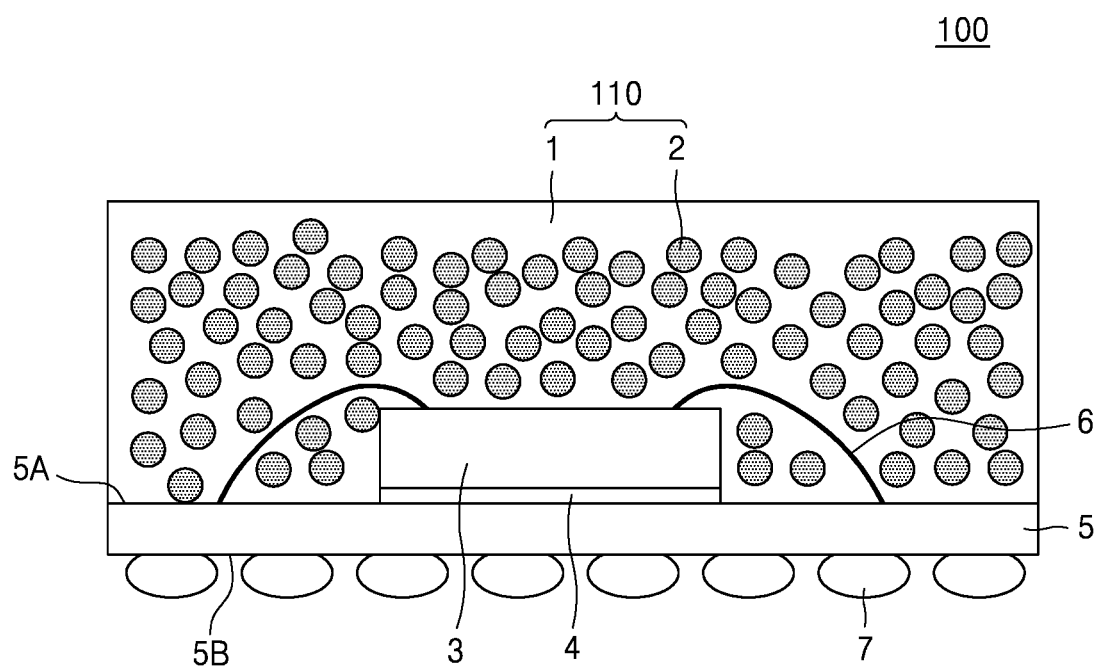
FIG. 4 is a cross-sectional view that shows a schematic structure of a semiconductor package according to an embodiment.

FIG. 4 is a cross-sectional view that shows a schematic structure of a semiconductor package 100 according to an embodiment.

Referring to FIG. 4, the semiconductor package 100 includes a substrate 5; a die attach film 4 on the substrate 5, a chip 3 on the substrate 5 and attached on the substrate 5 through the die attach film 4; connecting portions 6 that are like bonding wires for electrically interconnecting the chip 3 and the substrate 5; and a molding portion 110 that encapsulate the chip 3 and the connecting portions 6 and protects a mounting structure including the substrate 5, the chip 3 mounted on the substrate 5, and the connecting portions 6.

The molding portion 110 may be applied such that completely covers the chip 3 and the connecting portions 6 on the substrate 5.

The molding portion 110 is obtained by using the molding composition for a semiconductor package according to an embodiment described herein. The molding portion 110 includes a molding resin 1 and one or more fillers dispersed in the molding resin. The molding portion 110 may have a form in which the fillers 2 are dispersed in a matrix formed by curing the liquid crystalline epoxy compound.

On the substrate 5, a plurality of solder balls 7 for electrically connecting the chip 3 with an external circuit (not shown) are formed on a surface 5B opposite to a mounting surface 5A, on which the chip 3 is mounted.

A process of forming the molding portion 110 that encapsulates the chip 3 mounted on the substrate 5 may be performed by using a low-pressure transfer molding process to prepare a semiconductor package, for example, the semiconductor package 100 shown in FIG. 4 by using a composition described herein. However, embodiments of the inventive concept of the present invention are not limited thereto, for example, an injection molding process and a casting process may be used instead of the low-pressure transfer molding process.

The composition according to an embodiment may protect a chip region in the semiconductor package from moisture. Thus, reliability of the semiconductor package under relatively moist conditions may improve.

Figure 5:
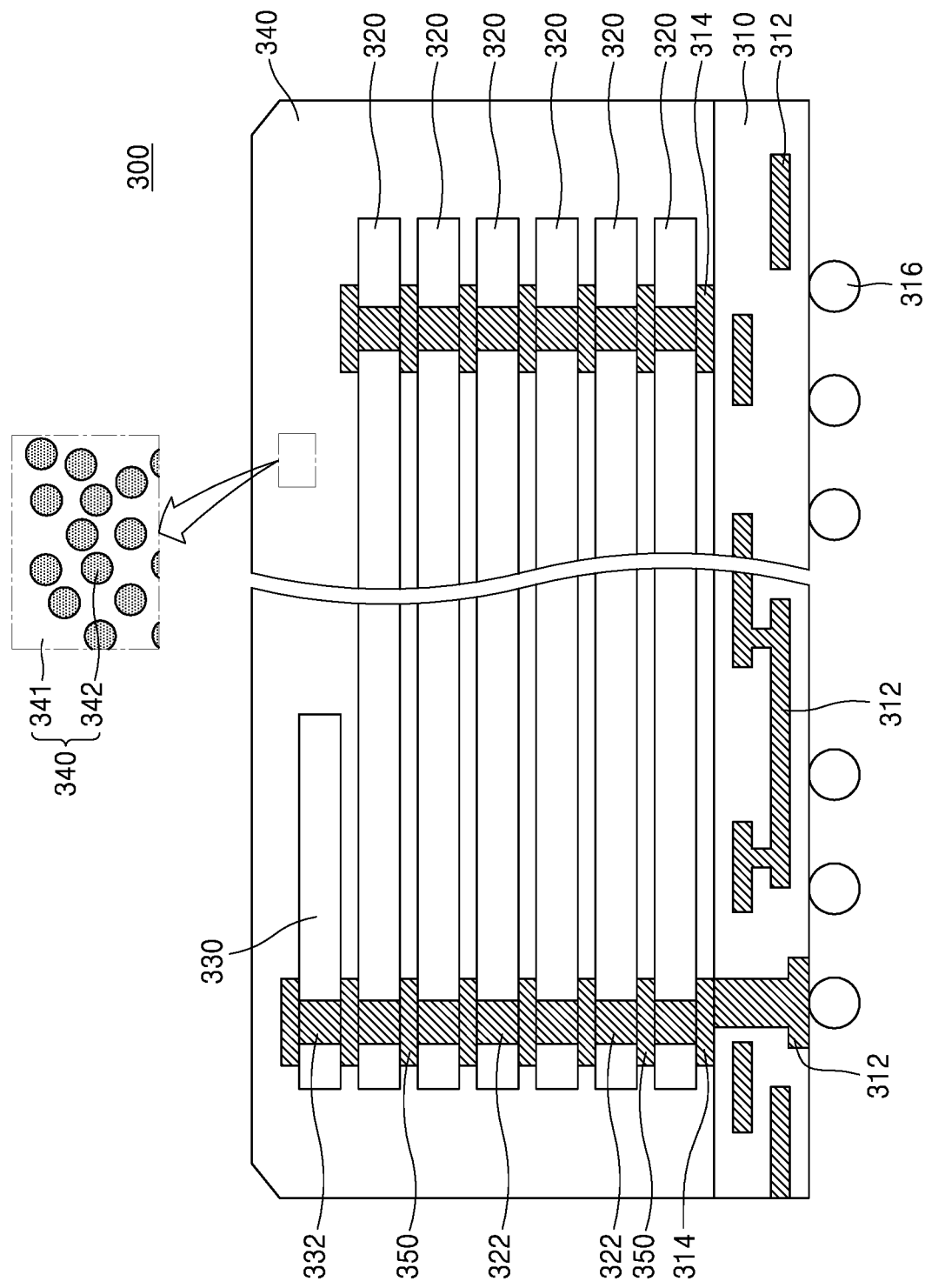
FIG. 5 is a cross-sectional view that shows a main configuration of an integrated circuit device according to an embodiment.

FIG. 5 is a cross-sectional view of a main configuration of an integrated circuit device 300 according to an embodiment.

Referring to FIG. 5, the integrated circuit device 300 includes a plurality of semiconductor chips 320 sequentially stacked on a package substrate 310 and separated by a connecting conductor spacer 350. A control chip 330 is connected on the plurality of semiconductor chips 320. A stacked structure of the plurality of semiconductor chips 320 and the control chip 330 is encapsulated by a molding portion 340 on the package substrate 310. The molding portion 340 may have a similar structure as the molding portion 110 described above with reference to FIG. 4. The molding portion 340 includes the molding composition for a semiconductor package according to an embodiment. The molding portion 340 includes a molding resin 341 and a plurality of fillers 342 dispersed in the molding resin 341. Descriptions of the molding resin 341 and the plurality of fillers 342 are the same as with reference to descriptions of the molding resin 1 and one or more fillers 2 of FIG. 4.

As shown in FIG. 5, six semiconductor chips 320 are vertically stacked on each other, but the number and a stacked direction of the semiconductor chips 320 are not limited thereto. For example, the number of semiconductor chips 320 may be more than or less than six, as needed. The semiconductor chips 320 may be arranged on the package substrate 310 in a horizontal direction, or in a connecting structure where the plurality of semiconductor chips 320 are connected in both a vertical and a horizontal direction. In some embodiments, the control chip 330 may be omitted.

The package substrate 310 may be formed of a flexible printed circuit board, a rigid printed circuit board, or a combination thereof. The package substrate 310 includes a substrate internal wire 312 and a connecting terminal 314. The connecting terminal 314 may be formed on one surface of the package substrate 310. A soldering ball 316 is formed on the other surface of the package substrate 310. The connecting terminal 314 may be electrically connected to the soldering ball 316 via the substrate internal wire 312.

In some embodiments, the solder ball 316 may be replaced by a conductive bump or a lead grid array (LGA).

The plurality of semiconductor chips 320 and the control chip 330 include connecting structures 322 and 332, respectively. In some embodiments, the connecting structures 322 and 332 may have a through silicon via (TSV) contact structure.

The connecting structures 322 and 332 of the plurality of semiconductor chips 320 and the control chip 330 may be electrically connected to the connecting terminal 314 of the package substrate 310 through a connecting portion 350 such as a bump.

Each of the plurality of semiconductor chips 320 may include a system large-scale integration (LSI), a flash memory, a dynamic random access memory (DRAM), a static random access memory (SRAM), an electrically erasable and programmable read only memory (EEPROM), a phase change random access memory (PRAM), a magnetic random access memory (MRAM), or a resistive random access memory (RRAM). The control chip 330 may include logic circuits, such as serializer/deserializer (SER/DES) circuit.

Figure 6:
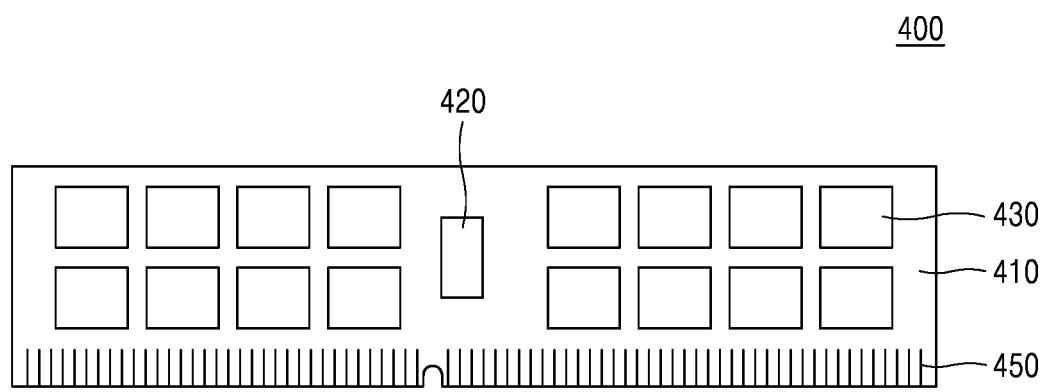
FIG. 6 is a cross-sectional view that shows a main configuration of an integrated circuit device according to an embodiment.

FIG. 6 is a plan view of a main configuration of an integrated circuit device 400 according to an embodiment.

An integrated circuit device 400 includes a module substrate 410, a control chip 420 mounted on the module substrate 410, and a plurality of semiconductor packages 430. A plurality of input and output terminals 450 are formed at the module substrate 410.

Each of the plurality of semiconductor packages 430 includes at least one of the semiconductor package 100 described with reference to FIG. 4 and the integrated circuit device 300 described with reference to FIG. 5.

Figure 7:
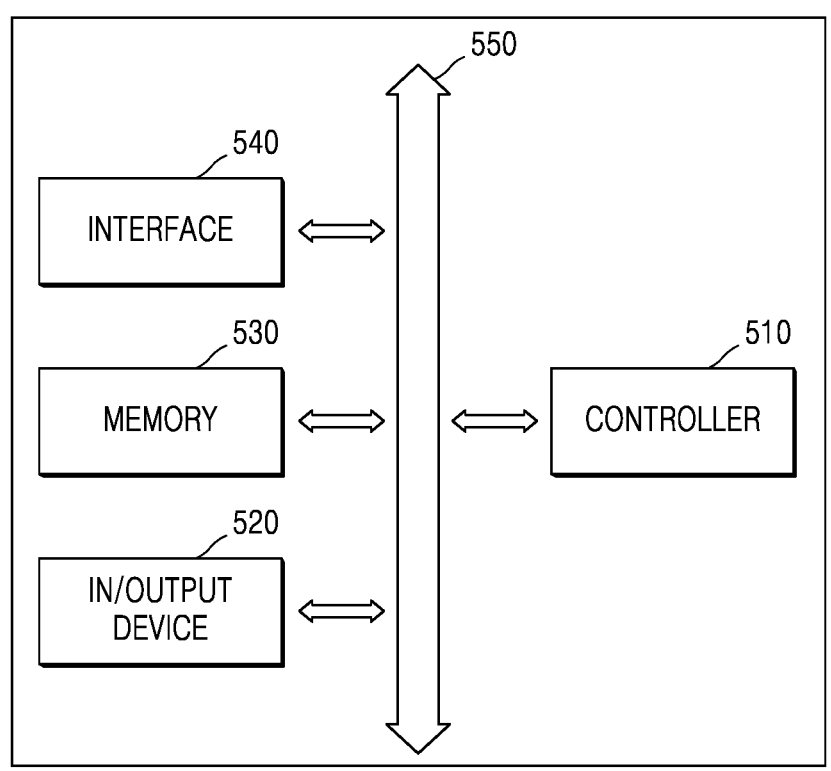
FIG. 7 is a diagram illustrating a main configuration of an integrated circuit device according to an embodiment.

FIG. 7 is a diagram of a main configuration of an integrated circuit device 500 according to an embodiment.

The integrated circuit device 500 includes a controller 510, an input/output device 520, a memory 530, and an interface 540. The integrated circuit device 500 may be a mobile system or a system for receiving or transmitting information. In some embodiments, the mobile system may be at least one of a personal digital assistant (PDA), a mobile computer, a web tablet, a wireless phone, a mobile phone, a digital music player, and a memory card.

In some embodiments, the controller 510 may be a microprocessor, a digital signal processor, or a micro-controller.

The input/output device 520 is used for data input and output of the integrated circuit device 500. The integrated circuit device 500 may be connected to an external device, such as a personal computer or a network, by using the input/output device 520, and may exchange data with the external device. In some embodiments, the input/output device 520 is a keypad, a keyboard, or a display.

In some embodiments, the memory 530 stores program code and/or data for operating the controller 510. In some embodiments, the memory 530 stores data processed by the controller 510. At least one of the controller 510 and the memory 530 includes at least one of the semiconductor package 100 described with reference to FIG. 3 and the integrated circuit device 300 described with reference to FIG. 4.

The interface 540 operates as a data transmission path between the integrated circuit device 500 and one or more external devices. The controller 510, the input/output device 520, the memory 530, and the interface 540 may communicate with each other through a bus 550.

The integrated circuit device 500 may be included in a mobile phone, an MP3 player, a navigation system, a portable multimedia player (PMP), a solid state disk (SSD), or a household appliance.

Figure 8:
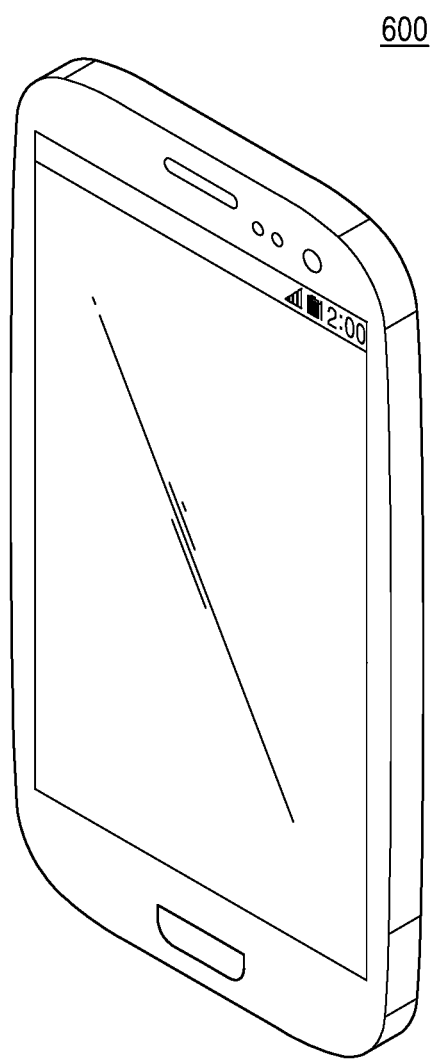
FIG. 8 is a schematic view of a mobile wireless phone according to an embodiment.

FIG. 8 is a schematic view of a mobile wireless phone 600 according to an embodiment. The mobile wireless phone 600 may include at least one of the semiconductor package 100 described with reference to FIG. 3, the integrated circuit device 300 described with reference to FIG. 5, the integrated circuit device 400 described with reference to FIG. 6, and the integrated circuit device 500 described with reference to FIG. 7.

Definitions of substituents used in the formulae of the present specification are the same as follows.

As used herein, the term "alkyl" refers to a fully saturated (no carbon-carbon multiple bonds), branched or unbranched (straight chain or linear) substituted or unsubstituted hydrocarbon group.

Example of the alkyl group are a methyl group, an ethyl group, an n-propyl group, an isopropyl group, an n-butyl group, an isobutyl group, a sec-butyl group, an n-pentyl group, an isopentyl group, a neopentyl group, an iso-amyl group, an n-hexyl group, a 3-methylhexyl group, a 2,2-dimethylpentyl group, a 2,3-dimethylpentyl group, and an n-heptyl group.

At least one hydrogen atom of the alkyl group may be substituted with a halogen atom, a C1-C20 alkyl group substituted with a halogen atom (e.g., $CF_3$, $CH_3CF_2$, $CH_2F$, or $CCl_3$), a C1-C20 alkoxy group, a C2-C20 alkoxyalkyl group, a hydroxyl group, a nitro group, a cyano group, an amino group, an alkylamino group, an amidino group, a hydrazine, a hydrazone, a carboxyl group or a salt thereof, a sulfonyl group, a sulfamoyl group, a sulfonic acid group or a salt thereof, a phosphoric acid or a salt thereof, a C1-C20 alkyl group, a C2-C20 alkenyl group, a C2-C20 alkynyl group, a C1-C20 heteroalkyl group, a C6-C20 aryl group, a C6-C20 arylalkyl group, a C6-C20 heteroaryl group, a C7-C20 heteroarylalkyl group, a C6-C20 heteroaryloxy group, a C6-C20 heteroaryloxyalkyl group, or a C6-C20 heteroarylalkyl group.

The term "substitution", e.g., in reference to $R_1$ to $R_{12}$, refers to the substitution of one or more hydrogen atoms with halogen atoms, halogen atom-substituted alkyl groups of C1-C8 (for example: $CCF_3$, $CHCF_2$, $CH_2F$, $CCl_3$, and the like), alkoxy groups of C1-C8, alkoxyalkyl groups of C2-C8, hydroxyl groups, nitro groups, cyano groups, amino groups, amidino groups, hydrazine, hydrazones, carboxylic groups or a salt thereof, sulfonyl groups, sulfamoyl groups, sulfonic acid groups or a salt thereof, phosphoric acids or a salt thereof, alkyl groups of C1-C8, alkenyl groups of C2-C8, alkynyl groups of C2-C8, heteroalkyl groups of C1-C8, aryl groups of C6-C14, arylalkyl groups of C6-C14, heteroaryl groups of C5-C10, heteroarylalkyl groups of C7-C8, heteroaryloxy groups of C6-C10, heteroaryloxyalkyl groups of C6-C10 or heteroarylalkyl groups of C6-C10.

Examples of "a halogen atom" include fluorine, bromine, chlorine, and iodine.

As used herein, the expression "a C1-C20 alkyl group substituted with a halogen atom" refers to a C1-C20 alkyl group substituted with at least one halo group, and examples of the C1-C20 alkyl group substituted with a halogen atom may include a monohaloalkyl and a polyhaloalkyl including a dihaloalkyl or a perhaloalkyl.

The monohaloalkyl has one iodine, bromine, chlorine, or fluorine in an alkyl group, and the dihaloalkyl and polyhaloalkyl refer to an alkyl group having at least two halogen atoms that are identical to or different from each other.

As used herein, the term "alkoxy" refers to "alkyl-O—", where the alkyl is the same as defined above. Examples of the alkoxy group may include a methoxy group, an ethoxy group, a propoxy group, a 2-propoxy group, a butoxy group, a tert-butoxy group, a pentyloxy group, a hexyloxy group, a cyclopropoxy group, and a cyclohexyloxy group At least one hydrogen atom in the alkoxy group may be substituted with the same substituent as described above in connection with the alkyl group.

As used herein, the term "alkoxyalkyl" refers to an alkyl group substituted with an alkoxy group. At least one hydrogen atom in the alkoxyalkyl group may be substituted with the same substituent as described above in connection with the alkyl group. In this regard, the term "alkoxyalkyl" includes a substituted alkoxyalkyl moiety.

As used herein, the term "alkenyl" refers to a branched or unbranched, substituted or unsubstituted hydrocarbon having at least one carbon-carbon double bond. Examples of the alkenyl group may include vinyl, allyl, butenyl, iso-propenyl, and iso-butenyl, and at least one hydrogen atom of the alkenyl group may be substituted with the same substituent as described above in connection with the alkyl group.

As used herein, the term "alkynyl" refers to a branched or unbranched, substituted or unsubstituted hydrocarbon having at least one carbon-carbon triple bond. Examples of the alkynyl group may include an ethynyl group, a butynyl group, an isobutynyl group, or an isopropynyl group.

At least one hydrogen atom of the alkynyl group may be substituted with the same substituent as described above in connection with the alkyl group.

As used herein, the term "aryl" is used alone or in combination, and refers to a substituted or unsubstituted aromatic hydrocarbon group having one or more rings.

The term "aryl" also refers to a group in which an aromatic ring is fused to one or more cycloalkyl rings.

Examples of the aryl group may include a phenyl group, a naphthyl group, or a tetrahydronaphthyl group.

At least one hydrogen atom of the aryl group may be substituted with the same substituent as described above in connection with the alkyl group.

As used herein, the term "arylalkyl" is an alkyl group substituted with an aryl group. Examples of the arylalkyl group may include a benzyl group, or a phenyl-$CH_2CH_2$—.

As used herein, the term "aryloxy" refers to an —O-aryl group, and examples of the aryloxy group may include a phenoxy group. At least one hydrogen atom of the aryloxy group may be substituted with the same substituent as described above in connection with the alkyl group.

As used herein, the term "heteroaryl" refers to a monocyclic or bicyclic organic compound that contains one or more hetero atoms selected from N, O, P, and S, and the remaining ring atoms are carbon atoms. The heteroaryl group may include, for example, 1 to 5 hetero atoms, and 5 to 10 ring members. S or N may be oxidized to various oxidation states.

Examples of a monocyclic heteroaryl group may include thienyl, pyrrolyl, imidazolyl, pyrazolyl, thiazolyl, isothiazolyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, isothiazol-3-yl, isothiazol-4-yl, isothiazol-5-yl, oxazol-2-yl, oxazol-4-yl, oxazol-5-yl, isooxazol-3-yl, isooxazol-4-yl, isooxazol-5-yl, 1,2,4-triazol-3-yl, 1,2,4-triazol-5-yl, 1,2,3-triazol-4-yl, 1,2,3-triazol-5-yl, tetrazolyl, pyrid-2-yl, pyrid-3-yl, 2-pyrazin-2yl, pyrazin-4-yl, pyrazin-5-yl, 2-pyrimidin-2-yl, 4-pyrimidin-2-yl, and 5-pyrimidin-2-yl.

As used herein, the term "heteroaryl" refers to a group in which a heteroaromatic ring is fused to one or more aryl, cycloaliphatic, or heterocyclic rings.

Examples of a bicyclic heteroaryl may include indolyl, isoindolyl, indazolyl, indolizinyl, purinyl, quinolizinyl, quinolinyl, isoquinolinyl, cinnolinyl, phthalazinyl, naphthyridinyl, quinazolinyl, quinaxalinyl, phenanthridinyl, phenathrolinyl, phenazinyl, phenothiazinyl, phenoxazinyl, benzisoquinolinyl, thieno[2,3-b]furanyl, furo[3,2-b]-pyranyl, 5H-pyrido[2,3-d]o-oxazinyl, 1H-pyrazolo[4,3-d]-oxazolyl, 4H-imidazo[4,5-d]thiazolyl, pyrazino[2,3-d]pyridazinyl, imidazo[2,1-b]thiazolyl, imidazo[1,2-b][1,2,4]triazinyl, 7-benzo[b]thienyl, benzoxazolyl, benzimidazolyl, benzothiazolyl, benzoxapinyl, benzoxazinyl, 1H-pyrrolo[1,2-b][2] benzazapinyl, benzofuryl, benzothiophenyl, benzotriazolyl, pyrrolo[2,3-b]pyridinyl, pyrrolo[3,2-c]pyridinyl, pyrrolo[3,2-b]pyridinyl, imidazo[4,5-b]pyridinyl, imidazo[4,5-c]pyridinyl, pyrazolo[4,3-d]pyridinyl, pyrazolo[4,3-c]pyridinyl, pyrazolo[3,4-c]pyridinyl, pyrazolo[3,4-d]pyridinyl, pyrazolo[3,4-b]pyridinyl, imidazo[1,2-a]pyridinyl, pyrazolo[1,5-a]pyridinyl, pyrrolo[1,2-b]pyridazinyl, imidazo[1,2-c]pyrimidinyl, pyrido[3,2-d]pyrimidinyl, pyrido[4,3-d]pyrimidinyl, pyrido[3,4-d]pyrimidinyl, pyrido[2,3-d]pyrimidinyl, pyrido[2,3-b]pyrazinyl, pyrido[3,4-b]pyrazinyl, pyrimido[5,4-d]pyrimidinyl, pyrazino[2,3-b]pyrazinyl, and pyrimido[4,5-d]pyrimidinyl.

At least one hydrogen atom in the heteroaryl group may be substituted with the same substituent as described above in connection with the alkyl group.

As used herein, the term "heteroarylalkyl" refers to an alkyl group substituted with a heteroaryl group.

As used herein, the term "heteroaryloxy" refers to an —O-heteroaryl moiety.

At least one hydrogen atom in the heteroaryloxy group may be substituted with the same substituent as described above in connection with the alkyl group.

As used herein, the term "heteroaryloxyalkyl" refers to an alkyl group substituted with a heteroaryloxy group. At least one hydrogen atom in the heteroaryloxyalkyl group may be substituted with the same substituent as described above in connection with the alkyl group.

As used herein, the term "carbocyclic" refers to saturated or partially unsaturated but non-aromatic monocyclic, bicyclic, or tricyclic hydrocarbon groups Examples of the monocyclic hydrocarbon group may include cyclopentyl, cyclopentenyl, cyclohexyl, and cyclohexenyl.

Examples of the bicyclic hydrocarbon group may include bornyl, decahydronaphthyl, bicyclo[2.1.1]hexyl, bicyclo[2.2.1]heptyl, bicyclo[2.2.1]heptenyl, and bicyclo[2.2.2]octyl.

Examples of the tricyclic hydrocarbon group may include adamantly.

At least one hydrogen atom in the carbocyclic group may be substituted with the same substituent as described above in connection with the alkyl group.

As used herein, the term "heterocyclic" refers to a ring containing 5 to 10 atoms including a hetero atom such as N, S, P, or O, and an example of the heterocyclic group is pyridyl. At least one hydrogen atom in the heterocyclic group may be substituted with the same substituent as described above in connection with the alkyl group.

As used herein, the term "heterocyclicoxy" refers to an —O-heterocyclyl group, and at least one hydrogen atom in the heterocyclicoxy group may be substituted with the same substituent as described above in connection with the alkyl group.

As used herein, the term "sulfonyl" refers to R''—SO$_2$—, wherein R'' is hydrogen, alkyl, aryl, heteroaryl, aryl-alkyl, heteroaryl-alkyl, alkoxy, aryloxy, cycloalkyl, or heterocyclyl.

As used herein, the term "sulfamoyl" includes H$_2$NS(O$_2$)—, alkyl-NHS(O$_2$)—, (alkyl)$_2$NS(O$_2$)— aryl-NHS(O$_2$)—, alkyl-(aryl)-NS(O$_2$)—, (aryl)$_2$NS(O)$_2$, heteroaryl-NHS(O$_2$)—, (aryl-alkyl)-NHS(O$_2$)—, or (heteroaryl-alkyl)-NHS(O$_2$)—.

At least one hydrogen atom of the sulfamoyl may be substituted with the same substituent as described above in connection with the alkyl group.

As used herein, the term "amino" refers to a compound in which a nitrogen atom is covalently bonded to at least one carbon or hetero atom. As used herein, the term "amino" includes —NH$_2$ and substituted moieties. The term also includes "alkyl amino", in which a nitrogen atom is bound to at least one additional alkyl group. The term also includes "arylamino" and "diarylamino" groups, wherein the nitrogen is bound to at least one or two independently selected aryl groups, respectively.

The terms "alkylene", "arylene", and "heteroarylene" refer to divalent groups obtained from an alkyl group, an aryl group, and a heteroaryl group, each respectively.

Hereinafter, one or more embodiments will be described in detail with reference to the following examples and comparative examples. These examples are not intended to limit the purpose and scope of the one or more embodiments.

Example 1

(1) Preparation of Epoxy Compound 188 grams (g) of naphthalene dicarboxylic acid (1 mol), 93 g of 4,4-biphenol (0.5 mol), 250 ml of sulfolane, and 4.5 g of p-TSA (25 mmol) were added to a 500 ml glass reactor. After the inside of the reactor was sufficiently exchange with nitrogen gas, the temperature in the reactor was raised to 180° C. under nitrogen gas flow, and the content of the reactor was refluxed for 4 hours while maintaining the temperature. The reaction product was washed with cool water and ethanol to prepare Intermediate-1.

200 ml of 95% ethanol, 260 g of Intermediate-1, 0.09 g of sodium hydrosulfite, and 12.2 g of 1,6-dibromohexane were added to a 1 liter (L) glass reactor, and the mixture was mixed and stirred while being refluxed. Then, 8.4 g of potassium hydroxide was dissolved in 100 milliliters (ml) of 95% ethanol and slowly added to the mixture in the reactor over 1 hour and refluxed for 8 hours. After cooling the mixture to room temperature, the solution was neutralized with a 30 wt % sulfuric acid, and then 500 ml of 95% ethanol was added. A precipitate was obtained and filtered. The precipitate was washed with ethanol several times and then vacuum-dried to prepare Intermediate-2.

45 g of Intermediate-2, 148 g of epichlorohydrin, and 80 g of isopropyl alcohol were added to a 500 ml reactor. After the inside of the reactor was sufficiently exchanged with nitrogen gas, the temperature in the reactor was raised to 50° C. under nitrogen gas flow, and the content of the reactor was refluxed for 5 hours while maintaining the temperature in the reactor. A temperature in the reactor was decreased to room temperature, and 3.2 g of NaOH (25% aqueous solution) was added dropwise to the content for 1 hour. The temperature of the reactor was raised up 60° C., and the content in the reactor was stirred for 4 hours. The temperature in the reactor was reduced to room temperature, and a compound represented by Formula 6 was obtained by filtration and re-crystallization with CH$_2$Cl$_2$/CH$_3$OH.

Formula 6

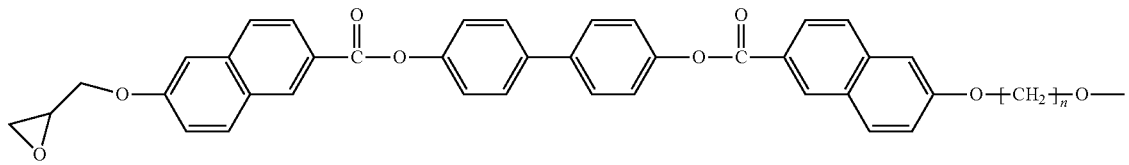

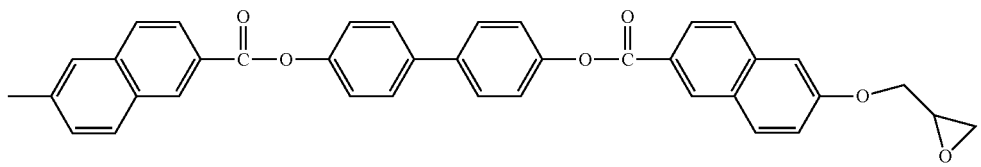

Here, an epoxy compound represented by Formula 6, in which n=6, was prepared.

(2) Preparation of Composite

The epoxy compound and a phenolic curing agent MEH7500 (a polyfunctional phenol, available from Myeongsung Chemical) were mixed in an equivalent ratio of 1:1, and 5 g of the mixture was poured into an aluminum mold, heated to 190° C. and cured to prepare a cured composite sample.

Example 2

An epoxy compound was prepared in the same manner as in Example 1, and a composite was prepared by using the epoxy compound, except that n was controlled to be n=8 in Formula 6.

Comparative Example 1

An epoxy compound was prepared in the same manner as in Example 1, and a composite was prepared by using the epoxy compound, except that n was controlled to be n=0 in Formula 6, i.e., no spacer.

Example 2a

An epoxy compound was prepared in the same manner as in Example 1, and a composite was prepared by using the epoxy compound, except that n was controlled to be n=10 in Formula 6.

Evaluation Example 1: Thermal Conductivity Evaluation

Thermal conductivities of the composites prepared in Example 1 and Comparative Example 1 were evaluated, and the results are shown in Table 1.

The thermal conductivities were measured by using a C-THERM TCI™ thermal conductivity meter using a modified transient plane source (MTPS) method.

TABLE 1

|  | Composite with epoxy compound of Formula 6 n (—$CH_2$—) spacer | Thermal conductivity (W/mK) |
| --- | --- | --- |
| CE 1 | 0 (no spacer) | 0.49 |
| Ex. 1 | 6 | 0.58 |
| Ex. 2 | 8 | 0.64 |
| Ex. 2a | 10 | 0.38 |

As shown in Table 1, the thermal conductivity of composites prepared with the epoxy compound of Formula 6, but with differences to the spacer including the number of methylene units (n) as well as an absence of a spacer as in CE 1 are reported. As indicated, the thermal conductivity of the composites with an epoxy compound where n is 6, 8, or 10 are each greater than CE1, where the epoxy compound includes the same mesogenic units, but does not have a spacer A. Accordingly, there is a technical advantage to include a set number of methylene units to the spacer. Moreover, the data of Table 1 suggests that if the methylene spacer is too long (see, Ex. 2 compared to Ex. 2a), π-π stacking between the mesogenic units may begin to weaken due to an increase in flexibility of the epoxy compound in the cured resin composite, and this may explain why the thermal conductivity of the composite of Ex. 2a is lower than Ex. 2.

Example 3

(1) Preparation of Epoxy Compound 10 g of 4,6-diamino resorcinol dihydrochloride (DAR), 13 g of hydroxy benzoic acid (HBA), and 150 g of polyphosphoric acid (PPA) were added to a 500 ml glass reactor, mixed for 12 hours at room temperature under nitrogen gas flow, and then the mixture was reacted at 180° C. for 2 hours. Water was added to the resulting solution to form a precipitate, and the precipitate was obtained through filtration. The precipitate was washed with water several times to remove PPA and dried in a vacuum oven at 60° C. for 12 hours to prepare Intermediate-1.

200 ml of 95% ethanol, 172 g of Intermediate-1, 0.09 g of sodium hydrosulfite, and 11 g of 1,4-dibromobutane were added to a 1 L glass reactor, and the mixture was mixed and stirred under reflux. Then, 8.4 g of potassium hydroxide was dissolved in 100 ml of 95% ethanol and slowly added to the mixture in the reactor over a 1 hour period, and then refluxed for 8 hours. After cooling the mixture to room temperature, the solution was neutralized with a 30 wt % sulfuric acid. 500 ml of 95% ethanol was added to the resultant reaction solution, and a precipitate formed that was separated by filtration. The precipitate was washed with ethanol several times and then vacuum-dried to prepare Intermediate-2.

30 g of Intermediate-2, 148 g of epichlorohydrin, and 80 g of isopropyl alcohol were added to a 500 ml reactor. After the inside of the reactor was sufficiently exchanged with nitrogen gas, the temperature in the reactor was raised to 50° C. under nitrogen gas flow, and the content of the reactor was refluxed for 5 hours. The temperature in the reactor was decreased to room temperature, and 3.2 g of NaOH (25% aqueous solution) was added dropwise to the reaction mixture over a 1 hour period. The temperature of the reactor was raised up 60° C., and the contents in the reactor was stirred for 4 hours. The temperature in the reactor was decreased to room temperature, and a compound represented by Formula 7 was obtained by filtration and re-crystallization with $CH_2Cl_2/CH_3OH$.

Formula 7

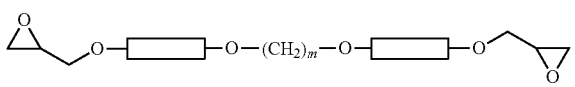

In Formula 7, ▭ is

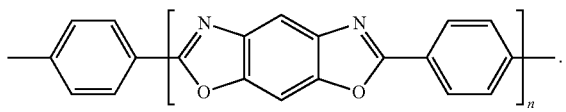

In Example 3, an epoxy compound represented by Formula 7, in which n=1 and m=4, was prepared.

(2) Preparation of Composite

A composite was prepared by using an epoxy compound prepared in the same manner as in Example 1.

Example 4

An epoxy compound prepared in the same manner as in Example 3, and the epoxy compound was used to prepare a composite, except that n and m were controlled to be n=2 and m=4 in Formula 7.

Example 5

An epoxy compound prepared in the same manner as in Example 3, and the epoxy compound was used to prepare a composite, except that n and m were controlled to be n=2 and m=8 in Formula 7.

Example 6

An epoxy compound prepared in the same manner as in Example 3, and the epoxy compound was used to prepare a composite, except that n and m were controlled to be n=2 and m=12 in Formula 7.

Example 7

An epoxy compound prepared in the same manner as in Example 3, and the epoxy compound was used to prepare a composite, except that n and m were controlled to be n=3 and m=8 in Formula 7.

Example 8

(1) Preparation of Epoxy Compound 0.2 mol of hydroxybenzoic acid (HBA) and 1.8 mol of hydroquinone (HQ) were added to a 500 ml glass reactor, and these were mixed for 12 hours at room temperature under nitrogen gas flow and reacted at 260° C. for 2.5 hours. Water was added to the resulting solution to form a precipitate, and the precipitate was obtained through filtration. The resultant was re-crystallized using a mixture solvent including ethanol and water (at a volume ratio of 1:1), underwent filtration, and dried in a vacuum oven at 60° C. for 12 hours to prepare Intermediate-1.

0.1 mol of hydroxyl phenyl hydroxyl benzoate (HPHB), which was Intermediate-1, 0.2 mol of HBA, 120 ml of p-xylene, and 0.6 g of p-toluenesulfonic acid were added to a 500 ml glass reactor, and these were refluxed for 48 hours to react in the reactor while removing water formed as a by-product. Then, the resultant underwent filtration to obtain a precipitate, and the precipitate was washed 4 times with a large amount of ethanol to synthesize Intermediate-2.

200 ml of 95% ethanol, 35 g of Intermediate-2, 0.05 g of sodium hydrosulfite, and 2.2 g of 1,3-dibromopropane were added to a 1 L glass reactor, and these were mixed and stirred while being refluxed. Then, 1.7 g of potassium hydroxide was dissolved in 100 ml of 95% ethanol and slowly added to the mixture in the reactor for 1 hour and refluxed for 8 hours. After cooling the mixture to room temperature, the solution was neutralized with a 30 wt % sulfuric acid, and then 500 ml of 95% ethanol was added to the resultant. A precipitate was obtained through filtration of the resultant. The precipitate was washed with ethanol several times and then vacuum-dried to prepare Intermediate-3.

30 g of Intermediate-3, 148 g of epichlorohydrin, and 80 g of isopropyl alcohol were added to a 500 ml reactor. After the inside of the reactor was sufficiently exchanged with nitrogen gas, the temperature in the reactor was raised to 50° C. under nitrogen gas flow, and the content of the reactor was refluxed for 5 hours. The temperature in the reactor was decreased to room temperature, and 3.2 g of NaOH (25% aqueous solution) was added dropwise to the reaction mixture over a 1 hour period. The temperature of the reactor was raised to 60° C., and the content in the reactor was stirred for 4 hours. The temperature in the reactor was decreased to room temperature, and a compound represented by Formula 8 was obtained by filtration and re-crystallization with $CH_2Cl_2/CH_3OH$.

Formula 8

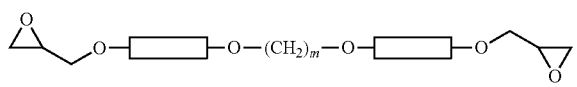

In Formula 8, ▭ is

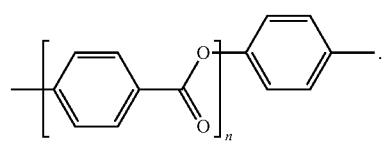

In Example 8, an epoxy compound represented by Formula 8, in which n=2 and m=4, was prepared.

Example 9

An epoxy compound prepared in the same manner as in Example 8, and the epoxy compound was used to prepare a composite, except that n and m were controlled to be n=3 and m=4 in Formula 8.

(2) Preparation of Composite

A composite was prepared by using the epoxy compound in the same manner as in the preparation of a composite in Example 1.

Example 10

An epoxy compound prepared in the same manner as in Example 8, and the epoxy compound was used to prepare a composite, except that n and m were controlled to be n=3 and m=6 in Formula 8.

Example 11

An epoxy compound prepared in the same manner as in Example 8, and the epoxy compound was used to prepare a composite, except that n and m were controlled to be n=3 and m=8 in Formula 8.

Example 12

An epoxy compound prepared in the same manner as in Example 8, and the epoxy compound was used to prepare a composite, except that n and m were controlled to be n=3 and m=12 in Formula 8.

Example 13

An epoxy compound prepared in the same manner as in Example 8, and the epoxy compound was used to prepare a composite, except that n and m were controlled to be n=4 and m=8 in Formula 8.

Example 14

10 g of 4,6-diaminoresorcinol dihydrochloride, 13 g of HBA, and 150 g of PPA were added to a 500 ml glass reactor, and these were mixed for 12 hours at room temperature under nitrogen gas flow and reacted at 180° C. for 2 hours. Water was added to the resulting solution to form a precipitate, and the precipitate was obtained through filtration. The precipitate was washed with water several times to remove PPA and dried in a vacuum oven at 60° C. for 12 hours to prepare Intermediate-1.

34.4 g of Intermediate-1, 28 g of HBA, and 11 g of HQ were added to a 500 ml glass reactor, and the mixture was mixed for 12 hours at room temperature under nitrogen gas flow, and then reacted at 260° C. for 2.5 hours. Water was added to the resulting solution to form a precipitate, and the precipitate was obtained through filtration. The resultant was re-crystallized using a mixture solvent including ethanol and water (at a volume ratio of 1:1), underwent filtration, and dried in a vacuum oven at 60° C. for 12 hours to prepare Intermediate-2.

200 ml of 95% ethanol, 35 g of Intermediate-2, 0.05 g of sodium hydrosulfite, and 2.2 g of 1,4-dibromobutane were added to a 1 L glass reactor, and these were mixed and stirred while being refluxed. Then, 1.7 g of potassium hydroxide was dissolved in 100 ml of 95% ethanol and slowly added to the mixture in the reactor over a 1 hour period and then the mixture was refluxed for 8 hours. After cooling the mixture to room temperature, the solution was neutralized with a 30 wt % sulfuric acid, and then 500 ml of 95% ethanol was added to the resultant. A precipitate was obtained through filtration of the resultant. The precipitate was washed with ethanol several times and then vacuum-dried to prepare Intermediate-3.

56 g of Intermediate-3, 148 g of epichlorohydrin, and 80 g of isopropyl alcohol were added to a 500 ml reactor. After the inside of the reactor was sufficiently exchanged with nitrogen gas, the temperature in the reactor was raised to 50° C. under nitrogen gas flow, and the content of the reactor was refluxed for 5 hours. The temperature in the reactor was decreased to room temperature, and 3.2 g of NaOH (25% aqueous solution) was added dropwise to the content over a 1 hour period. The temperature of the reactor was raised to 60° C., and the content in the reactor was stirred for 4 hours. The temperature in the reactor was decreased to room temperature, and a compound represented by Formula 9 was obtained by filtration and re-crystallization with $CH_2Cl_2$/$CH_3OH$.

Formula 9

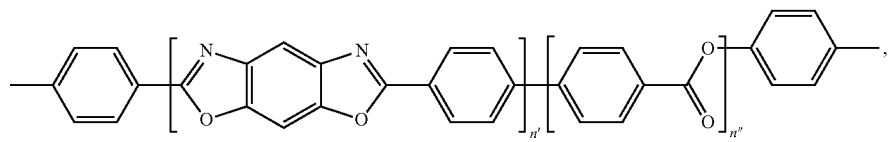

In Formula 9,

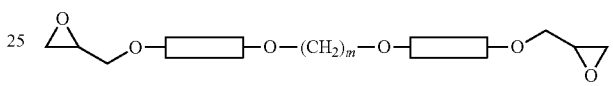 is wherein n'=1, n'=2, and m=4.

Comparative Example 3

An epoxy compound prepared in the same manner as in Example 3, and the epoxy compound was used to prepare a composite, except that n and m were controlled to be n=1 and m=0 in Formula 7.

Comparative Example 4

An epoxy compound prepared in the same manner as in Example 3, and the epoxy compound was used to prepare a composite, except that n and m were controlled to be n=2 and m=0 in Formula 7.

Comparative Example 5

An epoxy compound prepared in the same manner as in Example 3, and the epoxy compound was used to prepare a composite, except that n and m were controlled to be n=3 and m=0 in Formula 7.

Comparative Example 6

An epoxy compound prepared in the same manner as in Example 8, and the epoxy compound was used to prepare a composite, except that n and m were controlled to be n=1 and m=0 in Formula 8.

Comparative Example 7

An epoxy compound prepared in the same manner as in Example 8, and the epoxy compound was used to prepare a composite, except that n and m were controlled to be n=2 and m=0 in Formula 8.

Comparative Example 8

An epoxy compound prepared in the same manner as in Example 8, and the epoxy compound was used to prepare a composite, except that n and m were controlled to be n=3 and m=0 in Formula 8.

Comparative Example 9

An epoxy compound prepared in the same manner as in Example 8, and the epoxy compound was used to prepare a composite, except that n and m were controlled to be n=4 and m=0 in Formula 8.

Comparative Example 10

An epoxy compound prepared in the same manner as in Example 8, and the epoxy compound was used to prepare a composite, except that n and m were controlled to be n=1 and m=4 in Formula 8.

Comparative Example 11

A composite was prepared in the same manner as in Example 3, except that a phenol aralkyl epoxy resin, NC3000 (available from Nippon Kayaku Co., Ltd.), was used as an epoxy compound.

Comparative Example 12

A composite was prepared in the same manner as in Example 3, except that a tetramethyl biphenol epoxy resin, SE-400H (available from Shin-A T&C), was used as an epoxy compound.

Evaluation Example 1: Physical Property Evaluation

Thermal conductivities and melting temperatures of the composites prepared in Examples 3 to 14 and Comparative Examples 3 to 12 were evaluated, and the results are shown in Table 2.

The thermal conductivities were measured by using a C-THERM TCI™ thermal conductivity meter using a modified transient plane source (MTPS) method.

The melting temperatures were measured while increasing a temperature at a rate of 10° C. per minute in a differential scanning calorimetry (DSC).

TABLE 2

| | Epoxy compound | | | | Physical property | |
|---|---|---|---|---|---|---|
| | Structure of mesogenic unit | n | Length of M (Å) | —CH$_2$— m | Thermal conduct. (W/mK) | Melt temp. (°C.) |
| Ex. 3 | | 1 | 16 | 4 | 0.73 | 163 |
| Ex. 4 | | 2 | 29 | 4 | 0.86 | 183 |
| Ex. 5 | | 2 | 29 | 8 | 0.96 | 148 |
| Ex. 6 | | 2 | 29 | 12 | 0.73 | 131 |
| Ex. 7 | | 3 | 39 | 8 | 0.8 | 128 |
| Ex. 8 | | 2 | 17 | 3 | 0.38 | 165 |
| Ex. 9 | | 2 | 23 | 4 | 0.53 | 174 |
| Ex. 10 | | 2 | 23 | 5 | 0.59 | 153 |
| Ex. 11 | | 2 | 23 | 6 | 0.56 | 139 |
| Ex. 12 | | 2 | 23 | 7 | 0.60 | 122 |
| Ex. 13 | | 2 | 29 | 8 | 0.54 | 148 |
| Ex. 14 | | n' = 1, n'' = 2 | 36 | 4 | 0.53 | 180 |
| CE3 | | 1 | 16 | 0 | 0.46 | 191 |
| CE4 | | 2 | 29 | 0 | 0.51 | 210 |
| CE5 | | 3 | 39 | 0 | 0.7 | 225 |
| CE6 | | 1 | 9 | 0 | 0.31 | 180 |
| CE7 | | 2 | 17 | 0 | 0.51 | 192 |
| CE8 | | 3 | 23 | 0 | 0.59 | 201 |
| CE9 | | 4 | 29 | 0 | 0.60 | 210 |
| CE10 | | 1 | 9 | 4 | 0.38 | 153 |

TABLE 2-continued

| | Epoxy compound | | | | Physical property | |
|---|---|---|---|---|---|---|
| | Structure of mesogenic unit | n | Length of M (Å) | —CH$_2$— m | Thermal conduct. (W/mK) | Melt temp. (°C.) |
| CE11 | 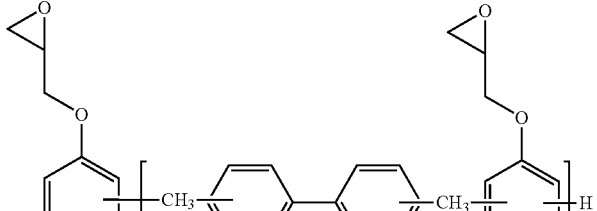<br>NC3000 | N/A | N/A | N/A | 0.2 | 82 |
| CE12 | 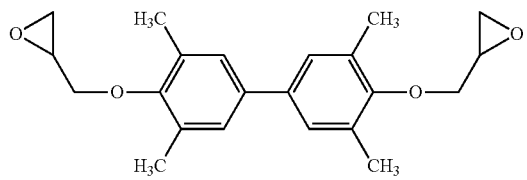<br>SE-400H | N/A | N/A | N/A | 0.33 | 109 |

As shown in Table 2, the epoxy compounds prepared in Examples 3 to 14 had 10 Å or more of the total length of the mesogenic units on one side of a spacer A, which is a flexible group, (i.e., "n×(length of M)" in Table 1), and the melting temperatures of the composites prepared by using the epoxy compounds are shown to be 190° C. or less. Thus, it may be known that thermal conductivities of the composites of Examples 3 to 14 with a range of 0.38 W/mK to 0.96 W/mK are excellent, and the acceptable melting temperatures provide excellent processability In contrast, most of epoxy composites of Comparative Examples 3 to 10 have melting temperatures that are greater than 190° C. if the comparative composite used a liquid crystalline epoxy compound having no spacer, or having a mesogenic unit of less than 10 Å. In regards to CE6 and CE10, which do have melting temperatures less than 190° C., the thermal conductivity of these to comparative composites is too low and not acceptable, and thus, the composites are not appropriate as a material for a semiconductor package. Moreover, the composites of Comparative Examples 11 and 12, which used conventional epoxy resins, had significantly low thermal conductivities, and thus these too are not appropriate as a material for a semiconductor package.

As described above, according to one or more embodiments, the epoxy compounds described herein provide composite materials with high thermal conductivities, and thus, possess the necessary e high heat-radiation characteristics as a package material. Moreover, if the described epoxy compounds are used, a molding composition capable of securing a high thermal conductivity with less amount of a filler may be provided. The high-thermal conductive epoxy compound may be used in various electric and electronic fields that require heat-radiation characteristics as well as in a semiconductor.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An epoxy compound represented by Formula 1:

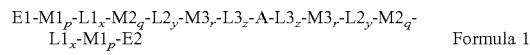

wherein, in Formula 1,

M1, M2, and M3 are each independently a mesogenic unit selected from compounds of Formula 2, and p, q, and r are each independently 0 or 1, wherein at least one of p, q, and r is 1;

L1, L2, and L3 are each independently —O—, —C(=O)O—, —O—C(=O)O—, —(CH$_2$)$_2$—C(=O)—, —CH=CH—C(=O)—, —S(=O)—, —CH=N—, —NHC(=O)O—, —C(=O)NH—, —OC(=O)NHS(=O)O—, or —CH$_2$(C$_6$H$_4$)C(=O)—, and x, y, and z are each independently 0 or 1;

A is a spacer, and is a substituted or unsubstituted C1-C12 alkylene group, a substituted or unsubstituted C2-C12 alkenylene group, a substituted or unsubstituted C2-C12 alkynylene group, a substituted or unsubstituted C6-C12 arylene group, or a substituted or unsubstituted C4-C12 heteroarylene group; and E1 and E2 are the same or different epoxy-containing group;

Formula 2
(2-1) 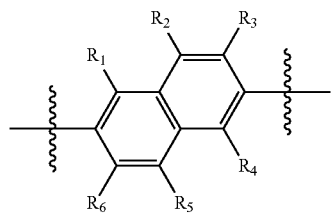
(2-2) 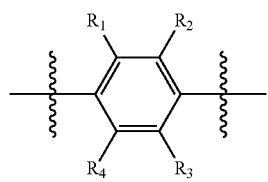
(2-3) 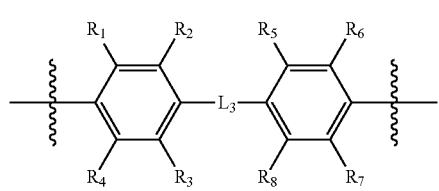
(2-4) 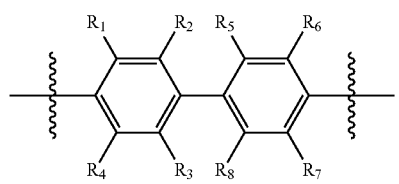
(2-5) 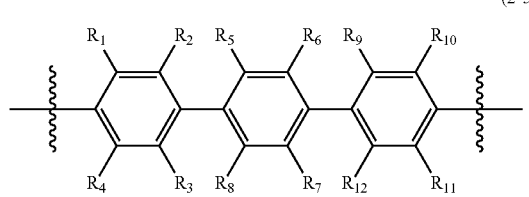
(2-6) 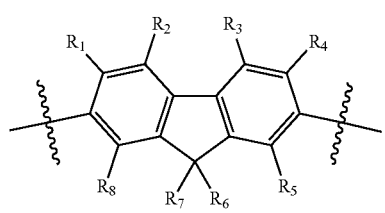
(2-7) 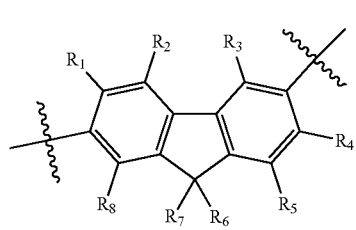
(2-8) 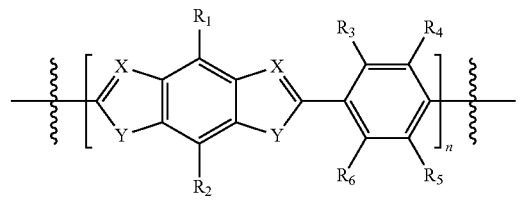
(2-9) 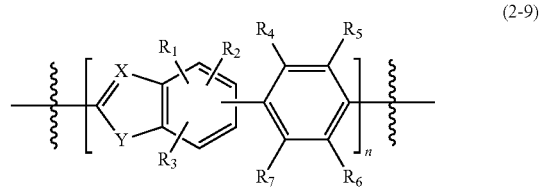
(2-10) 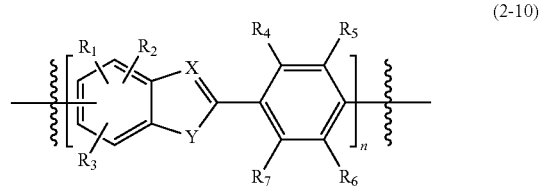
(2-11) 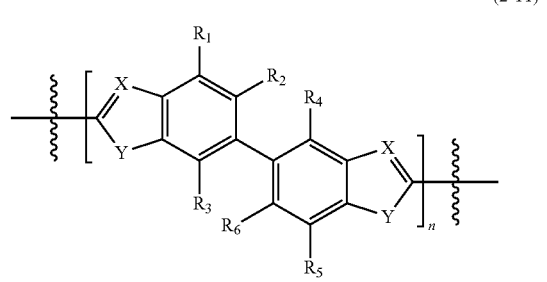
(2-12) 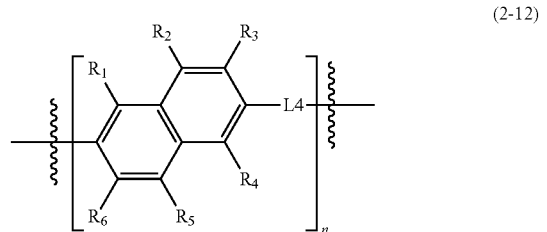
(2-13) 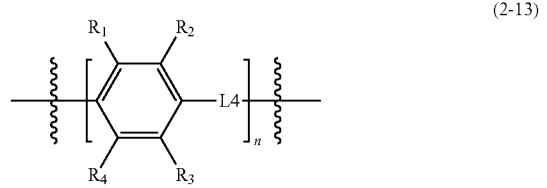
(2-14) 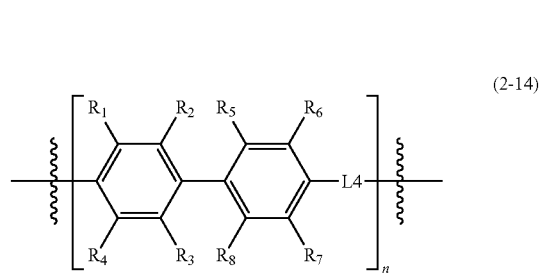

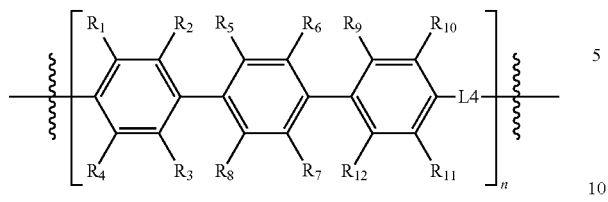

(2-15)

wherein, in Formula 2,

R$_1$ to R$_{12}$ are each independently a hydrogen atom, a halogen atom, C1-C30 alkyl group, C2-C30 alkenyl group, C2-C30 alkynyl group, C1-C30 alkoxy group, C2-C30 alkoxyalkyl group, C1-C30 heteroalkyl group, C6-C30 aryl group, C7-C30 arylalkyl group, C2-C30 heteroaryl group, C3-C30 heteroarylalkyl group, C2-C30 heteroaryloxy group, C3-C30 heteroaryloxyalkyl group, C6-C30 heteroarylalkyloxy group, a hydroxy group, a nitro group, a cyano group, an amino group, an amidino group, a hydrazine group, a hydrazone group, a carboxyl group or a salt thereof, a sulfonyl group, a sulfamoyl group, a sulfonic acid or a salt thereof, or a phosphoric acid or a salt thereof, L4 of Formula 2-12 to 2-15 is —O—, —C(=O)O—, —O—C(=O)O—, —(CH$_2$)$_2$—C(=O)—, —CH=CH—C(=O)—, —S(=O)—, —CH=N—, —NHC(=O)O—, —C(=O)NH—, —OC(=O)NHS(=O)O—, or —CH$_2$(C$_6$H$_4$)C(=O)—, and X is N, P, or As, Y is O, S, or Se, and n is an integer of 1 to 10; and wherein a segment M1$_p$-L1$_x$-M2$_q$-L2$_y$-M3$_r$ of Formula 1 has at least one group structure represented by Formula 3:

Formula 3

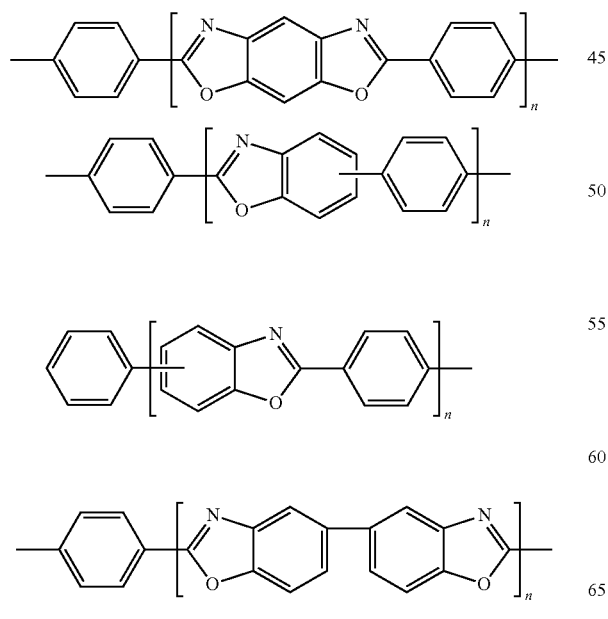

wherein, in Formula 3, n is an integer of 1 to 10, or at least one group structure represented by Formula 4, where n of Formula 4 is an integer of 3 to 10;

Formula 4

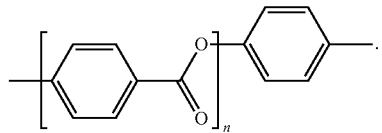

2. The epoxy compound of claim 1, wherein, in Formula 2, R$_1$ to R$_{12}$ are each independently a hydrogen atom, a C1-C10 alkyl group, a C2-C10 alkenyl group, a C2-C10 alkynyl group, a C1-C10 alkoxy group, a C2-C30 alkoxyalkyl group, or a C1-C30 heteroalkyl group.

3. The epoxy compound of claim 1, wherein the mesogenic units M1, M2, and M3, are each independently represented by Formula 2a:

Formula 2a

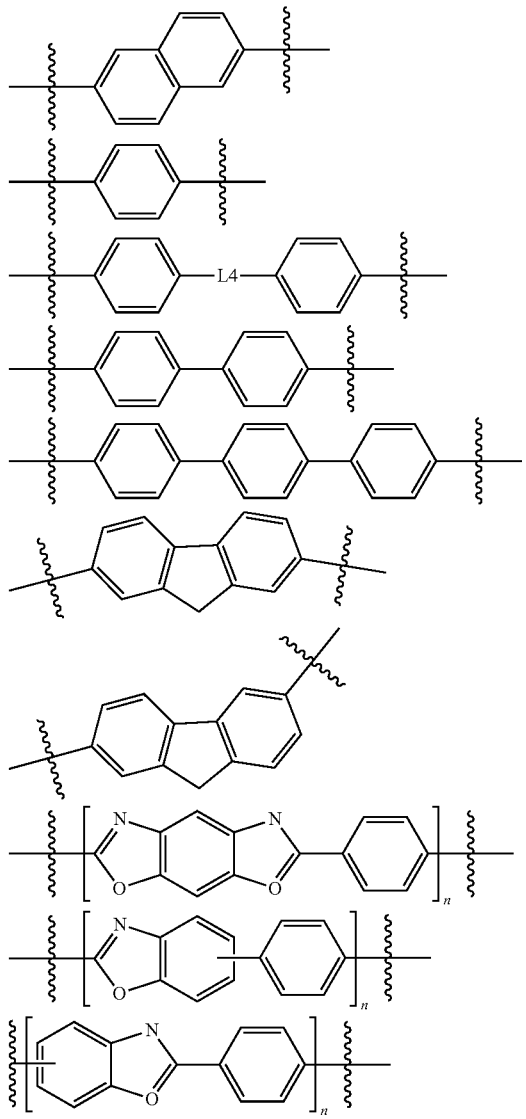

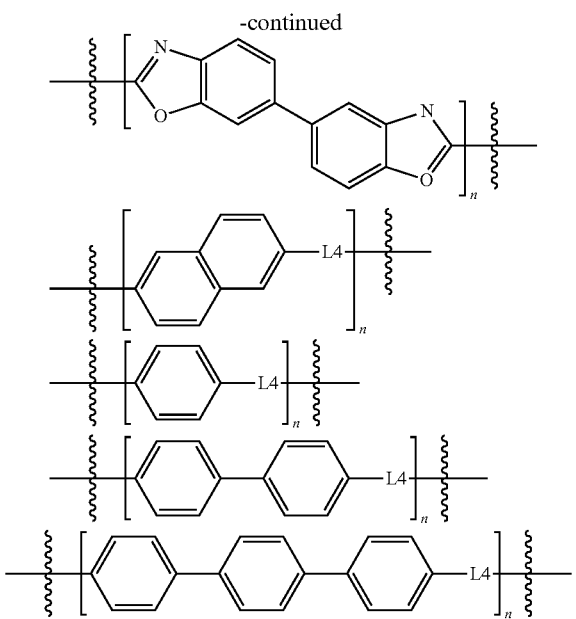

wherein, in Formula 2a, L4 is —O—, —C(=O)O—, —O—C(=O)O—, —(CH₂)₂—C(=O)—, —CH=CH—C(=O)—, —S(=O)—, —CH=N—, —NHC(=O)O—, —C(=O)NH—, —OC(=O)NHS(=O)O—, or —CH₂(C₆H₄)C(=O)—, and n is an integer of 1 to 10.

4. The epoxy compound of claim 1, wherein, in Formula 1, M1 and M3 are the same mesogenic unit.

5. The epoxy compound of claim 1, wherein, in Formula 1, at least one of M1 or M3 is a naphthalene unit, and M2 is a mesogenic unit of Formula 2, but does not include a naphthalene unit.

6. The epoxy compound of claim 1, wherein, the segment M1$_p$-L1$_x$-M2$_q$-L2$_y$-M3$_r$ is at least one group structure represented by Formula 3:

Formula 3

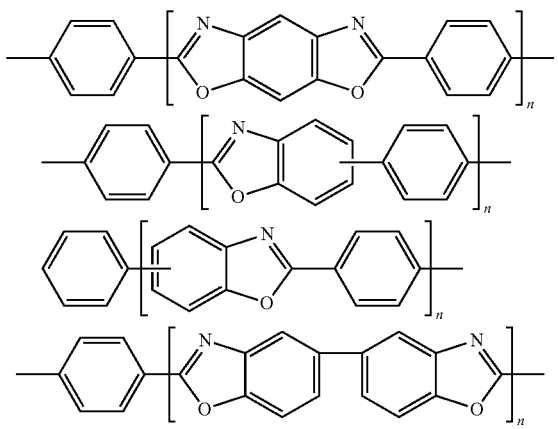

wherein, in Formula 3, n is an integer of 1 to 10.

7. The epoxy compound of claim 1, wherein, the segment M1$_p$-L1$_x$-M2$_q$-L2$_y$-M3$_r$ is at least one group structure represented by Formula 4.

8. The epoxy compound of claim 1, wherein the spacer A is —(CH₂)$_n$—, —(CF₂)$_n$—, (C₂H₄)$_n$—, or —(C₂F₄)$_n$—, wherein n is an integer of 1 to 6.

9. The epoxy compound of claim 1, wherein the epoxy-containing groups E1 and E2 are independently represented by Formula 5:

Formula 5

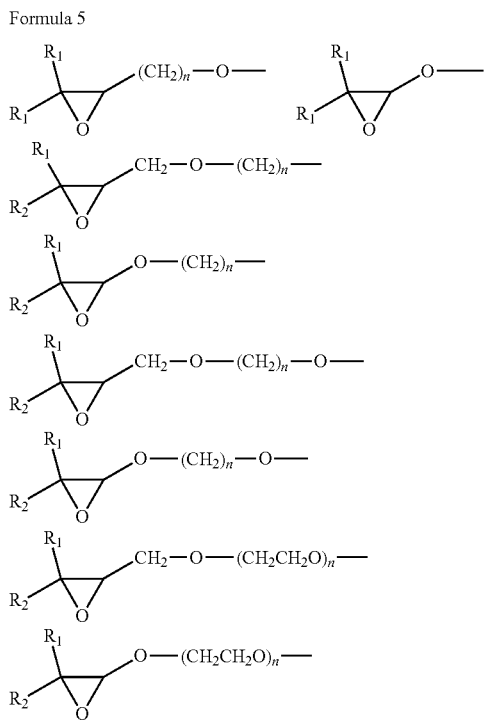

wherein, in Formula 5,

R₁ and R₂ are each independently a hydrogen atom, a C1-C10 alkyl group, a C2-C10 alkenyl group, a C2-C10 alkynyl group, a C1-C30 alkoxy group, a C2-C30 alkoxyalkyl group, or a C1-C30 heteroalkyl group, wherein n is an integer of 1 to 10.

10. The epoxy compound of claim 1, wherein the epoxy-containing groups E1 and E2 are independently represented by Formula 5a:

Formula 5a

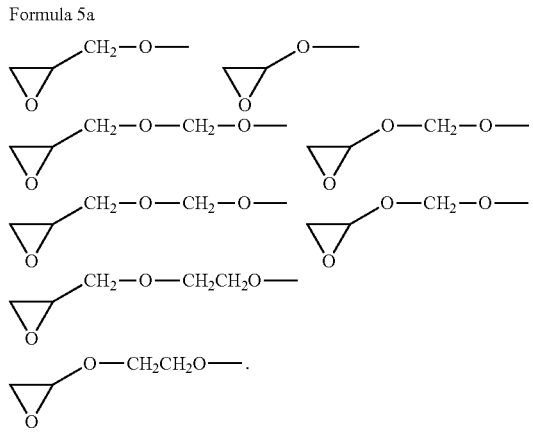

11. The epoxy compound of claim 1, wherein the total length of the mesogenic units M1, M2, and M3, present on each side of the spacer A is at least about 10 Å.

12. The epoxy compound of claim 1, wherein the total length of the mesogenic units M1, M2, and M3, present on each side of the spacer A is in a range of about 10 angstroms to about 40 angstroms.

13. The epoxy compound of claim 1, wherein the melting temperature of the epoxy compound is about 190° C. or less.

14. The epoxy compound of claim 1, wherein a thermal conductivity of the epoxy compound is about 0.4 W/mK or greater.

15. A composition comprising the epoxy compound of claim 1.

16. The composition of claim 15 further comprising a filler, wherein the filler comprises an inorganic material, an organic material, or a combination thereof.

17. The composition of claim 16, wherein the inorganic material comprises at least one of silicon oxide, calcium carbonate, magnesium carbonate, alumina, magnesia, clay, titania, talc, calcium silicate, antimony oxide, glass fibers, or eucryptite ceramic, and
the organic material comprises at least one of polyethyleneimine, ethylene glycol, or polyethylene glycol.

18. The composition of claim 16, wherein an amount of the filler is in a range of about 40 parts to about 99 parts by weight based on 100 parts by weight of the epoxy compound.

19. The composition of claim 15 further comprising at least one of a curing agent, a curing accelerator, a reaction regulator, a release agent, a coupling agent, a stress relieving agent, or an auxiliary flame retardant.

20. The composition of claim 15, wherein the composition further comprises at least one of a biphenyl epoxy resin, a novolac epoxy resin, a dicyclopentadienyl epoxy resin, a bisphenol epoxy resin, a terpene epoxy resin, an aralkyl epoxy resin, a multi-functional epoxy resin, a naphthalene epoxy resin, or a halogenated epoxy resin.

21. A material for a semiconductor package comprising the epoxy compound of claim 1.

22. An epoxy compound represented by Formula 1:

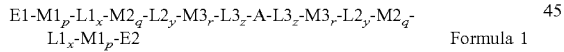

wherein, in Formula 1,

M1, M2, and M3 are each independently a mesogenic unit selected from compounds of Formula 2, and p, q, and r are each independently 0 or 1, wherein at least one of p, q, and r is 1;

L1, L2, and L3 are each independently —O—, —C(=O)O—, —O—C(=O)O—, —(CH$_2$)$_2$—C(=O)—, —CH=CH—C(=O)—, —S(=O)—, —CH=N—, —NHC(=O)O—, —C(=O)NH—, —OC(=O)NHS(=O)O—, or —CH$_2$(C$_6$H$_4$)C(=O)—, and x, y, and z are each independently 0 or 1;

A is a spacer, and is a substituted or unsubstituted C1-C12 alkylene group, a substituted or unsubstituted C2-C12 alkenylene group, a substituted or unsubstituted C2-C12 alkynylene group, a substituted or unsubstituted C6-C12 arylene group, or a substituted or unsubstituted C4-C12 heteroarylene group;

E1 and E2 are the same or different epoxy-containing group;

Formula 2

(2-1)
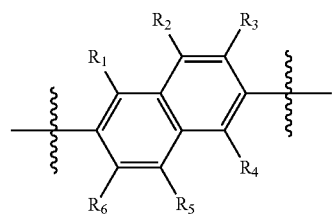

(2-2)
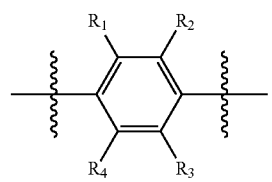

(2-3)
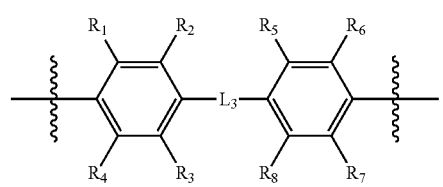

(2-4)
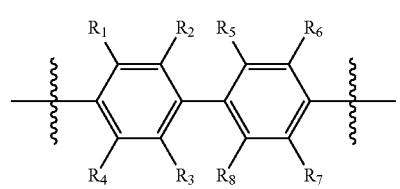

(2-5)
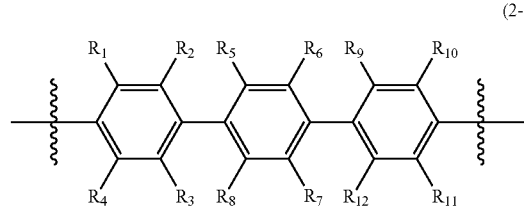

(2-6)
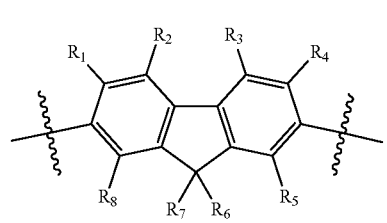

(2-7)
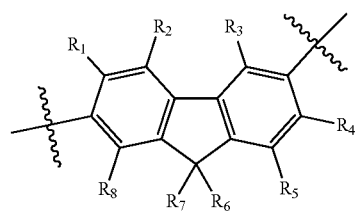

(2-8)
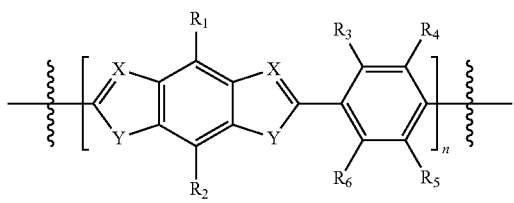

(2-9)
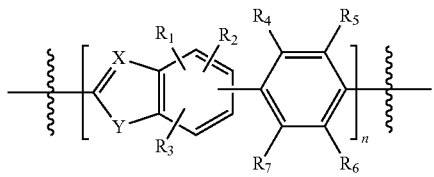

(2-10)
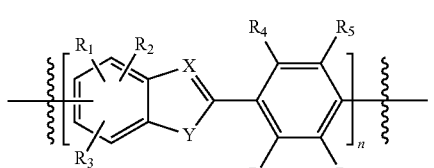

(2-11)
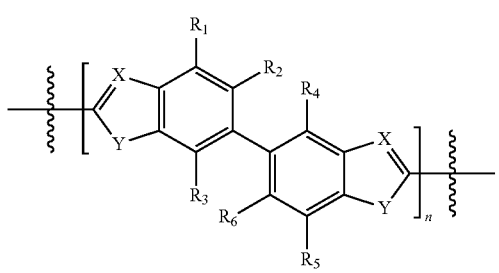

(2-12)
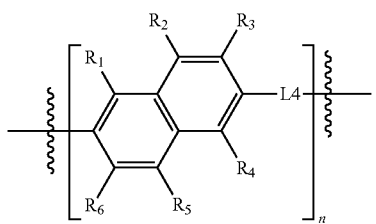

(2-13)
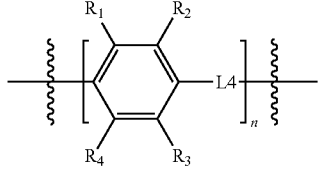

(2-14)
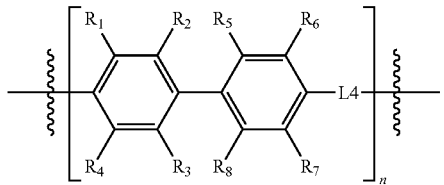

(2-15)
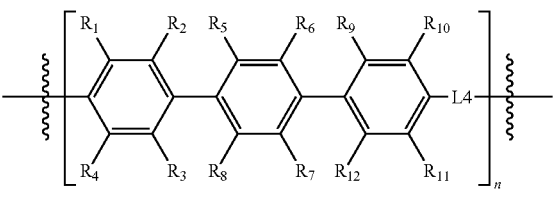

wherein, in Formula 2, $R_1$ to $R_{12}$ are each independently a hydrogen atom, a halogen atom, C1-C30 alkyl group, C2-C30 alkenyl group, C2-C30 alkynyl group, C1-C30 alkoxy group, C2-C30 alkoxyalkyl group, C1-C30 heteroalkyl group, C6-C30 aryl group, C7-C30 arylalkyl group, C2-C30 heteroaryl group, C3-C30 heteroarylalkyl group, C2-C30 heteroaryloxy group, C3-C30 heteroaryloxyalkyl group, C6-C30 heteroarylalkyloxy group, a hydroxy group, a nitro group, a cyano group, an amino group, an amidino group, a hydrazine group, a hydrazone group, a carboxyl group or a salt thereof, a sulfonyl group, a sulfamoyl group, a sulfonic acid or a salt thereof, or a phosphoric acid or a salt thereof, L4 of Formula 2-12 to 2-15 is —O—, —C(=O)O—, —O—C(=O)O—, —(CH$_2$)$_2$—C(=O)—, —CH=CH—C(=O)—, —S(=O)—, —CH=N—, —NHC(=O)O—, —C(=O)NH—, —OC(=O)NHS(=O)O—, or —CH$_2$(C$_6$H$_4$)C(=O)—, and X is N, P, or As, Y is O, S, or Se, and n is an integer of 1 to 10, wherein the epoxy compound of Formula 1 has a segment M1$_p$-L1$_x$-M2$_q$-L2$_y$-M3$_r$ represented by Formula 3:

Formula 3

![Formula 3 structures]

wherein, in Formula 3, n is an integer of 1 to 6.

* * * * *